(12) United States Patent
Yu et al.

(10) Patent No.: US 9,741,901 B2
(45) Date of Patent: Aug. 22, 2017

(54) TWO-TERMINAL ELECTRONIC DEVICES AND THEIR METHODS OF FABRICATION

(71) Applicant: CBRITE INC., Goleta, CA (US)

(72) Inventors: Gang Yu, Santa Barbara, CA (US); Chan-Long Shieh, Paradise Valley, AZ (US); Zhao Chen, Goleta, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

(21) Appl. No.: 14/339,210

(22) Filed: Jul. 23, 2014

(65) Prior Publication Data

US 2015/0014627 A1 Jan. 15, 2015

Related U.S. Application Data

(63) Continuation-in-part of application No. 13/467,539, filed on May 9, 2012, now abandoned, which is a
(Continued)

(51) Int. Cl.
*H01L 27/32* (2006.01)
*H01L 27/146* (2006.01)
(Continued)

(52) U.S. Cl.
CPC ........ *H01L 33/42* (2013.01); *H01L 27/14665* (2013.01); *H01L 27/14669* (2013.01);
(Continued)

(58) Field of Classification Search
USPC ...... 257/43, 13, 77, 42, 12, 40, 79; 438/478, 438/99, 34, 73
See application file for complete search history.

(56) References Cited

U.S. PATENT DOCUMENTS

| 4,042,293 A | 8/1977 | Hanak et al. |
| 4,105,513 A | 8/1978 | Nishino et al. |

(Continued)

FOREIGN PATENT DOCUMENTS

| CN | 1383168 A | 12/2002 |
| CN | 1717803 A | 1/2006 |

(Continued)

OTHER PUBLICATIONS

U.S. Appl. No. 11/430,075, filed May 8, 2006, Lee et al.
(Continued)

*Primary Examiner* — Zandra Smith
*Assistant Examiner* — Lawrence Tynes, Jr.
(74) *Attorney, Agent, or Firm* — Weaver Austin Villeneuve & Sampson LLP

(57) ABSTRACT

Two-terminal electronic devices, such as photodetectors, photovoltaic devices and electroluminescent devices, are provided. The devices include a first electrode residing on a substrate, wherein the first electrode comprises a layer of metal; an I-layer comprising an inorganic insulating or broad band semiconducting material residing on top of the first electrode, and aligned with the first electrode, wherein the inorganic insulating or broad band semiconducting material is a compound of the metal of the first electrode; a semiconductor layer, preferably comprising a p-type semiconductor, residing over the I-layer; and a second electrode residing over the semiconductor layer, the electrode comprising a layer of a conductive material. The band gap of the material of the semiconductor layer, is preferably smaller than the band gap of the I-layer material. The band gap of the material of the I-layer is preferably greater than 2.5 eV.

27 Claims, 10 Drawing Sheets

Related U.S. Application Data continuation of application No. 13/015,013, filed on Jan. 27, 2011, now Pat. No. 8,193,594, which is a continuation of application No. 11/801,735, filed on May 9, 2007, now Pat. No. 7,898,042, said application No. 13/467,539 is a continuation-in-part of application No. 11/983,205, filed on Nov. 6, 2007, now Pat. No. 8,222,077.

(60) Provisional application No. 60/857,750, filed on Nov. 7, 2006.

(51) Int. Cl.
| | | |
|---|---|---|
| H01L 27/30 | (2006.01) | |
| H01L 33/00 | (2010.01) | |
| H01L 33/06 | (2010.01) | |
| H01L 33/34 | (2010.01) | |
| H01L 33/26 | (2010.01) | |
| H01L 33/42 | (2010.01) | |
| H01L 51/05 | (2006.01) | |
| H01L 31/072 | (2012.01) | |
| H01L 31/046 | (2014.01) | |
| H01L 31/0224 | (2006.01) | |
| H01L 31/0336 | (2006.01) | |
| H01L 31/032 | (2006.01) | |
| H01L 31/0312 | (2006.01) | |
| H01L 31/0272 | (2006.01) | |
| H01L 31/0352 | (2006.01) | |
| H01L 31/18 | (2006.01) | |
| H01L 51/42 | (2006.01) | |
| H01L 51/44 | (2006.01) | |
| H01L 51/56 | (2006.01) | |
| H01L 51/52 | (2006.01) | |
| H01L 51/50 | (2006.01) | |
| H01L 51/00 | (2006.01) | |

(52) U.S. Cl.
CPC .. *H01L 27/14676* (2013.01); *H01L 27/14683* (2013.01); *H01L 27/14696* (2013.01); *H01L 27/308* (2013.01); *H01L 31/046* (2014.12); *H01L 31/072* (2013.01); *H01L 33/005* (2013.01); *H01L 33/06* (2013.01); *H01L 33/26* (2013.01); *H01L 33/34* (2013.01); *H01L 51/0587* (2013.01); *H01L 27/307* (2013.01); *H01L 27/3241* (2013.01); *H01L 51/004* (2013.01); *H01L 51/0081* (2013.01); *H01L 51/0085* (2013.01); *H01L 51/4253* (2013.01); *H01L 51/502* (2013.01); *H01L 51/5088* (2013.01); *H01L 51/5092* (2013.01); *H01L 51/5096* (2013.01); *H01L 2251/5353* (2013.01); *H01L 2933/0016* (2013.01); *Y02E 10/50* (2013.01)

(56) References Cited

U.S. PATENT DOCUMENTS

| | | | |
|---|---|---|---|
| 4,223,308 A | | 9/1980 | Baraff et al. |
| 4,251,136 A | | 2/1981 | Miner et al. |
| 4,715,685 A | | 12/1987 | Yaniv et al. |
| 4,864,472 A | | 9/1989 | Yoshimura et al. |
| 4,952,984 A | | 8/1990 | Martens et al. |
| 4,977,097 A | * | 12/1990 | Meyers ................ H01L 31/073 438/94 |
| 5,117,298 A | | 5/1992 | Hirai |
| 5,122,889 A | | 6/1992 | Kaneko et al. |
| 5,189,136 A | | 2/1993 | Wudl et al. |
| 5,254,179 A | * | 10/1993 | Ricaud ............ H01L 31/022425 136/244 |
| 5,357,357 A | | 10/1994 | Imazeki et al. |
| 5,455,736 A | | 10/1995 | Nishiyama et al. |
| 5,464,990 A | | 11/1995 | Shiratsuki et al. |
| 5,483,263 A | | 1/1996 | Bird et al. |
| 5,485,294 A | | 1/1996 | Sugiyama et al. |
| 5,795,458 A | | 8/1998 | Miyoshi |
| 5,926,236 A | | 7/1999 | Den Boer et al. |
| 6,008,872 A | | 12/1999 | Den Boer et al. |
| 6,017,259 A | | 1/2000 | Motoi et al. |
| 6,087,196 A | | 7/2000 | Sturm et al. |
| 6,177,921 B1 | | 1/2001 | Comiskey et al. |
| 6,353,229 B1 | * | 3/2002 | Polischuk ......... H01L 27/14659 250/370.09 |
| 6,372,154 B1 | | 4/2002 | Li |
| 6,380,922 B1 | | 4/2002 | Lynch et al. |
| 6,437,769 B1 | | 8/2002 | Kobayashi et al. |
| 6,441,395 B1 | * | 8/2002 | Yu ......................... B82Y 10/00 257/291 |
| 6,468,828 B1 | * | 10/2002 | Glatfelter .......... H01L 31/02168 136/244 |
| 6,506,438 B2 | | 1/2003 | Duthaler et al. |
| 6,512,172 B1 | | 1/2003 | Salafsky et al. |
| 6,582,504 B1 | | 6/2003 | Fujita |
| 6,623,903 B2 | | 9/2003 | Lamotte |
| 6,707,060 B2 | | 3/2004 | Yu et al. |
| 6,734,460 B2 | | 5/2004 | Okumura et al. |
| 6,852,555 B1 | | 2/2005 | Roman et al. |
| 6,864,111 B2 | | 3/2005 | Yu et al. |
| 6,881,115 B2 | | 4/2005 | Yamamoto et al. |
| 6,891,237 B1 | | 5/2005 | Bao et al. |
| 6,958,251 B2 | | 10/2005 | Yamazaki |
| 7,030,412 B1 | | 4/2006 | Drzaic et al. |
| 7,161,797 B2 | | 1/2007 | Vaisman et al. |
| 7,405,775 B2 | | 7/2008 | Nilsson |
| 7,491,575 B2 | | 2/2009 | Wu et al. |
| 7,528,896 B2 | | 5/2009 | Nilsson |
| 7,898,042 B2 | | 3/2011 | Yu et al. |
| 8,193,594 B2 | | 6/2012 | Yu et al. |
| 8,222,077 B2 | | 7/2012 | Gong et al. |
| 8,253,910 B2 | | 8/2012 | Nilsson |
| 2002/0027636 A1 | | 3/2002 | Yamada |
| 2002/0053320 A1 | | 5/2002 | Duthaler et al. |
| 2002/0080637 A1 | | 6/2002 | Yi et al. |
| 2002/0106847 A1 | | 8/2002 | Kazlas et al. |
| 2002/0119584 A1 | | 8/2002 | Duthaler et al. |
| 2002/0127821 A1 | | 9/2002 | Ohya et al. |
| 2002/0179901 A1 | | 12/2002 | Arai et al. |
| 2004/0056180 A1 | | 3/2004 | Yu |
| 2004/0135518 A1 | | 7/2004 | Brune et al. |
| 2004/0179146 A1 | | 9/2004 | Nilsson |
| 2005/0105010 A1 | | 5/2005 | Oh et al. |
| 2005/0154119 A1 | | 7/2005 | Robeson et al. |
| 2005/0224788 A1 | | 10/2005 | Hsu et al. |
| 2005/0227081 A1 | | 10/2005 | Hsu et al. |
| 2006/0027804 A1 | | 2/2006 | Yamazaki et al. |
| 2006/0043297 A1 | * | 3/2006 | Ouvrier-Buffet ......... G01J 3/36 250/339.05 |
| 2006/0061716 A1 | | 3/2006 | Yamaguchi et al. |
| 2006/0076557 A1 | | 4/2006 | Waller et al. |
| 2006/0091397 A1 | | 5/2006 | Akimoto et al. |
| 2006/0092343 A1 | | 5/2006 | Nilsson |
| 2006/0145597 A1 | | 7/2006 | Brabec |
| 2007/0068571 A1 | * | 3/2007 | Li ....................... H01L 31/075 136/258 |
| 2008/0105870 A1 | | 5/2008 | Yu et al. |
| 2008/0138920 A1 | | 6/2008 | Nilsson |
| 2008/0169464 A1 | | 7/2008 | Gong et al. |
| 2008/0217547 A1 | * | 9/2008 | Lee ......................... G01T 1/24 250/370.09 |
| 2008/0295882 A1 | * | 12/2008 | Stephens ........... H01L 31/0236 136/244 |
| 2009/0085095 A1 | | 4/2009 | Kamath et al. |
| 2009/0224236 A1 | | 9/2009 | Nilsson |
| 2010/0294355 A1 | * | 11/2010 | Choi ................ H01L 31/035281 136/256 |
| 2010/0320391 A1 | * | 12/2010 | Antonuk ............ H01L 27/1462 250/366 |
| 2011/0147761 A1 | | 6/2011 | Yu et al. |

(56) References Cited

U.S. PATENT DOCUMENTS

| | | | | |
|---|---|---|---|---|
| 2012/0156827 A1* | 6/2012 | Michael | ............... | H01L 21/428 438/95 |
| 2013/0119396 A1 | 5/2013 | Yu et al. | | |
| 2013/0180564 A1* | 7/2013 | Hekmatshoartabari | | |
| | | | ............................ | H01L 31/075 136/244 |
| 2013/0180579 A1* | 7/2013 | Jin | ........................ | H01L 31/073 136/255 |

FOREIGN PATENT DOCUMENTS

| | | | |
|---|---|---|---|
| CN | 1739205 A | 2/2006 | |
| EP | 1 251 720 | 10/2002 | |
| JP | 61-089663 | 5/1986 | |
| JP | 62-138834 | 6/1987 | |
| JP | 64-052128 | 2/1989 | |
| JP | 01-109328 | 4/1989 | |
| JP | 01-125861 A | 5/1989 | |
| JP | 02-000831 | 1/1990 | |
| JP | 03-126275 A | 5/1991 | |
| JP | 03-269995 A | 12/1991 | |
| JP | 04-093078 | 3/1992 | |
| JP | 05-11278 A | 1/1993 | |
| JP | 05-080356 | 4/1993 | |
| JP | EP 0566972 A1 * | 10/1993 | ....... H01L 31/03765 |
| JP | 2004-071682 | 3/2004 | |
| WO | WO 96/19837 | 6/1996 | |
| WO | WO 99/39394 | 8/1999 | |
| WO | WO 00/65653 | 11/2000 | |
| WO | WO 2004/051750 | 6/2004 | |
| WO | WO 2004/066410 | 8/2004 | |
| WO | WO 2004/114008 | 12/2004 | |
| WO | WO 2005/090434 | 9/2005 | |
| WO | WO 2008/057553 | 5/2008 | |
| WO | WO 2008/057560 | 5/2008 | |
| WO | WO2012/071107 | 5/2012 | |
| WO | WO2012/138410 | 10/2012 | |
| WO | WO 2016/014345 | 1/2016 | |

OTHER PUBLICATIONS

U.S. Office Action dated Sep. 21, 2005 issued in U.S. Appl. No. 10/759,807.
U.S. Final Office Action dated Sep. 20, 2006 issued in U.S. Appl. No. 10/759,807.
U.S. Office Action dated Apr. 19, 2007 issued in U.S. Appl. No. 10/759,807.
U.S. Notice of Allowance dated Nov. 30, 2007 issued in U.S. Appl. No. 10/759,807.
U.S. Office Action dated Apr. 5, 2007 issued in U.S. Appl. No. 11/298,098.
U.S. Final Office Action dated May 1, 2008 issued in U.S. Appl. No. 11/298,098.
U.S. Office Action dated Jul. 8, 2008 issued in U.S. Appl. No. 12/009,386.
U.S. Notice of Allowance dated Feb. 10, 2009 issued in U.S. Appl. No. 12/009,386.
U.S. Office Action dated Jun. 28, 2011 issued in U.S. Appl. No. 12/411,210.
U.S. Final Office Action dated Feb. 7, 2012 issued in U.S. Appl. No. 12/411,210.
U.S. Notice of Allowance dated Apr. 27, 2012 issued in in U.S. Appl. No. 12/411,210.
U.S. Final Office Action dated Dec. 1, 2010 issued in U.S. Appl. No. 11/983,205.
U.S. Office Action dated May 24, 2010 issued in U.S. Appl. No. 11/983,205.
U.S. Office Action dated Feb. 14, 2011 issued in U.S. Appl. No. 11/983,205.
U.S. Office Action dated Jul. 22, 2011 issued in U.S. Appl. No. 11/983,205.
U.S. Notice of Allowance dated Feb. 27, 2012 issued in U.S. Appl. No. 11/983,205.
U.S. Office Action dated Sep. 4, 2009 issued in U.S. Appl. No. 11/801,735.
U.S. Final Office Action dated Mar. 30, 2010 issued in U.S. Appl. No. 11/801,735.
U.S. Notice of Allowance and Allowed Claims dated May 25, 2010 issued in U.S. Appl. No. 11/801,735.
U.S. Notice of Allowance dated Nov. 3, 2010 issued in U.S. Appl. No. 11/801,735.
U.S. Notice of Allowance dated Aug. 22, 2011 issued in U.S. Appl. No. 13/015,013.
U.S. Notice of Allowance dated Feb. 3, 2012 issued in U.S. Appl. No. 13/015,013.
U.S. Office Action dated Aug. 12, 2013 issued in U.S. Appl. No. 13/467,539.
U.S. Notice of Allowance dated Apr. 23, 2014 issued in U.S. Appl. No. 13/467,539.
PCT International Search Report dated Jul. 20, 2004 issued in PCT/US2004/001557.
PCT International Preliminary Report on Patentability and Written Opinion dated Jul. 22, 2005 issued in PCT/US2004/001557.
Chinese First Office Action dated Jul. 11, 2008 issued in CN 200480002330.9.
Chinese Second Office Action dated Dec. 26, 2008 issued in CN 200480002330.9.
Chinese Third Office Action dated Jul. 17, 2009 issued in CN 200480002330.9.
Chinese Fourth Office Action dated Jan. 8, 2010 issued in CN 200480002330.9.
EP Examination Report dated Feb. 2, 2010 issued in EP 04 703 079.6-1228.
EP Examination Report dated Mar. 9, 2011 issued in EP 04 703 079.6.
Japanese First Office Action dated Jan. 12, 2010 issued in JP 2006-501075.
Japanese Second Office Action (Decision of Final Rejection) dated Dec. 14, 2010 issued in JP 2006-501075.
PCT International Search Report and Written Opinion dated May 29, 2008 issued in PCT/US2007/023441.
PCT International Preliminary Report on Patentability and Written Opinion dated May 12, 2009 issued in PCT/US2007/023441.
Chinese First Office Action dated Dec. 14, 2010 issued in CN 200780049295.X.
Chinese Second Office Action dated Feb. 2, 2012 issued in CN 200780049295.X.
Chinese Third Office Action dated May 16, 2012 issued in CN 200780049295.X.
Chinese First Office Action dated Feb. 4, 2015 issued in CN 201310053255.X.
European Examination Report dated Jul. 22, 2013 issued in EP 07 861 785.9.
PCT International Search Report and Written Opinion dated May 29, 2008 issued in PCT/US2007/023427.
PCT International Preliminary Report on Patentability and Written Opinion dated May 12, 2009 issued in PCT/US2007/023427.
Chinese First Office Action dated Aug. 4, 2010 issued in CN 200780049394.8.
Chinese First Office Action dated Feb. 28, 2012 issued in CN 201110079484.X.
Chinese Second Office Action dated Nov. 1, 2012 issued in CN 201110079484.X.
Chinese Third Office Action dated Jul. 4, 2013 issued in CN 201110079484.X.
European First Office Action dated Aug. 12, 2013 issued in EP Application No. 07 861 782.6.
Baytron® for Solid Electrolyte Capacitors, [retrieved on Nov. 7, 2007], Retrieved from http://www.baytron.com/index.php?page_id=971.
Birnstock et al., "Screen-printed Passive Matrix Displays Based on Light-emitting Polymers" Applied Physics Letters, American Institute of Physics. New York, US, vol. 78, No. 24, Jun. 11, 2001 (Jun. 11, 2001), pp. 3905-3907, XP001077323 ISSN: 0003-6951 abstract.

(56) References Cited

OTHER PUBLICATIONS

Kamijama, S. et al., "Highly Reliable 2.5nm $Ta_2O_5$ Capacitor Process Technology for 256Mbit DRAMs" Electron Devices Meeting, Technical Digest., International Volume Issue, Dec. 8-11, 1991, pp. 827-830.
Shieh, C.-L. et al., U.S. Appl. No. 11/650,148, filed Jan. 5, 2007.
Y.-J. Xia et al., "Photocurrent response wavelength up to 1.1 μm from photovoltaic cells based on narrow-band-gap conjugated polymer and fullerene derivative", Applied Physics Letters 89, 081106 (200), 3 pp.
PCT International Search Report and Written Opinion dated Jan. 16, 2015 issued in PCT/US15/40815.
PCT Invitation to Pay Additional Fees dated Nov. 2, 2015 issued in PCT/US15/40815.
Chinese Office Action dated Nov. 30, 2015 issued in CN 201310053255.X.
Geffroy, B. et al., "Organic light-emitting diode (OLED) technology: materials, devices and display technologies," Polymer International, vol. 55, No. 6, Jun. 2006, pp. 572-582.

* cited by examiner

TWO-TERMINAL ELECTRONIC DEVICES AND THEIR METHODS OF FABRICATION

CROSS-REFERENCE TO RELATED APPLICATIONS

This application is a continuation-in-part of U.S. patent application Ser. No. 13/467,539, filed May 9, 2012, by Yu et al., which is a continuation of U.S. patent application Ser. No. 13/015,013, filed Jan. 27, 2011, now U.S. Pat. No. 8,193,594, issued Jun. 5, 2012, by Yu et al., which is a continuation of U.S. patent application Ser. No. 11/801,735, filed May 9, 2007, now U.S. Pat. No. 7,898,042, issued Mar. 1, 2011, by Yu et al., which claims benefit of U.S. Provisional Application No. 60/857,750 filed Nov. 7, 2006, titled "Metal-insulator-metal (MIM) devices and their methods of fabrication" naming Gong et al. as inventors, which applications are herein incorporated by reference for all purposes. U.S. patent application Ser. No. 13/467,539 is a continuation-in-part of U.S. patent application Ser. No. 11/983,205, filed Nov. 6, 2007, now U.S. Pat. No. 8,222,077, issued Jul. 17, 2012, by Gong et al., which claims benefit of U.S. Provisional Application No. 60/857,750 filed Nov. 7, 2006, which applications are herein incorporated by reference for all purposes.

FIELD OF THE INVENTION

The invention relates to two-terminal electronic devices, such as photodetectors, photovoltaic devices, electroluminescent devices and methods of their fabrication.

BACKGROUND OF THE INVENTION

Fabrication of electronic devices often requires multiple material deposition steps followed by patterning of deposited layers using photoresist-based techniques. These techniques can be expensive and time-consuming. In addition, deposition processes that are used in current fabrication methods often involve processing under vacuum, such as physical vapor deposition (PVD) and chemical vapor deposition (CVD). PVD and CVD apparatuses are expensive and their use increases the costs of electronic device fabrication. Moreover, stress that is developed during deposition process and/or patterning process is often significant and leads to low manufacturing yield. Examples of such conventionally manufactured devices include photosensing elements in digital X-ray imager made from p-i-n photodiodes based on amorphous silicon (a-Si). Plasma-enhanced chemical vapor deposition (PECVD) process used for deposition of a thick amorphous silicon layer in such device often leads to peeling that is encountered after the pixel in the device is patterned. Finally, patterning of a thin film stack having multiple layers using lithographic technique often results in an "undercut" phenomenon due to different etching rates of different layers. Such undercut makes pixel connection in the following processing steps very difficult.

Accordingly, there is a need for electronic devices that can be fabricated with minimal patterning, with low internal stress among different layers and with reduced costs. There is also an interest in developing imaging elements in display and thin film sensor arrays with improved mechanical stability.

SUMMARY

Two-terminal electronic devices, such as two-terminal photodetectors, photovoltaic devices, electroluminescent devices and high density arrays comprising two-terminal devices that can be fabricated with minimal or no photoresist-dependent patterning, are provided. The structure of the devices and the materials used in the device layers are selected such as to allow for less expensive processing than in traditional fabrication methods. Such structure can also significantly improve device mechanical properties, device storage time and stability in operation.

In a first aspect a two terminal device (e.g., a photodetector, an electroluminescent device, or a photovoltaic device) is provided. The device includes a first electrode residing on a substrate, wherein the first electrode comprises a layer of metal or metal alloy; an I-layer comprising an inorganic insulating or broad band semiconducting material residing on top of the first electrode, and aligned with the first electrode, wherein the inorganic insulating or broad band semiconducting material is a compound of the metal or metal alloy of the first electrode; a semiconductor layer residing over the I-layer, and a second electrode residing over the semiconductor layer, the electrode comprising a layer of a conductive material.

In a second aspect, a two terminal device is provided, wherein the device includes a first electrode residing on a substrate, wherein the first electrode comprises a layer of conductive material (e.g. a metal, metal alloy, a conductive oxide); an I-layer comprising an inorganic insulating or broad band semiconducting material residing on top of the first electrode (e.g., a metal oxide, metal nitride, metal-C—H—O self-aligned with the first electrode or shared by a plurality of first electrodes in an array); a semiconductor layer residing over the I-layer, wherein the semiconductor layer may include a stack (e.g., a first semiconductor sub-layer and a second semiconductor sub-layer comprising a p-type semiconductor); and a second electrode residing over the semiconductor layer, wherein the second electrode comprises a layer of a conductive material, and wherein at least one of the first and second electrodes is transparent.

The following embodiments are applicable to the devices of both the first and second aspect.

In some embodiments, the semiconductor layer of the two-terminal device comprises an organic and/or an organometallic material. In some embodiments, the semiconductor layer of the two-terminal device comprises an inorganic p-type semiconductor material. In some embodiments two terminal device is a photovoltaic device and/or a photodetector, and the semiconductor layer is capable of absorbing electromagnetic radiation in at least one spectral wavelength band selected from the group consisting of near-ultraviolet, visible, infrared and combinations thereof. In some embodiments the two-terminal device is an X-ray detector.

In some embodiments, the semiconductor layer of the two-terminal device preferably comprises at least two sub-layers. In one implementation the device is a photodetector or an electroluminescent device, which includes a first semiconductor sub-layer in contact with the I-layer, that is configured to generate charge upon irradiation with light, or is configured to generate light after being injected with a charge. The device further includes a second semiconductor sub-layer in contact with the second electrode where the second sub-layer includes a p-type semiconductor configured to conduct holes and block electrons. For example, the two terminal device may be an electroluminescent device and the first semiconductor sublayer configured to generate light under charge injection, may include at least one emitter selected from the group consisting of an organic emitter, an inorganic nano-particle emitter and combinations thereof. In one embodiment of an electroluminescent device, the first semiconductor sub-layer is a stack of sub-layers, each of which is configured to emit light at different wavelengths corresponding to different colors.

In one embodiment, the device is a two terminal electroluminescent device, wherein the first semiconductor sub-layer comprises inorganic semiconductor nanoparticles or quantum dots.

In some embodiments the two terminal device may include a stack of photodetecting or electroluminescent devices.

According to some embodiments, the semiconductor layer in the two-terminal device comprises an organic semiconductor and further comprises an inorganic semiconductor as a blend with the organic semiconductor or as a separate sublayer in contact with the organic semiconductor sublayer.

Typically the semiconductor in the semiconductor layer has a smaller band gap than the material of the I-layer. Further, the second electrode has a work function that is at least 0.3 eV greater than the work function of the first electrode, referring to absolute values.

In some embodiments the first electrode of a two terminal device is a metal or metal alloy selected from the group consisting of Mg, Ca, Sr, Ba, Ti, V, Cr, Mn, Ta, Al, Ga, In, Nb, Hf, Zn, Zr, Mo, Ni, Cu, Sn, Y and a metal alloy comprising any of these metals. The I-layer in some embodiments includes one or more of a metal oxide, a metal nitride, a metal fluoride, and a metal sulfide (or other chalcogenide). In some embodiments, the I-layer includes an oxide, nitride, fluoride, or sulfide of the same metal or metals that are present in the first electrode.

In some embodiments, the second electrode of the two-terminal device is substantially optically transparent. For example, the device may be a top-sensing photodetector (or a photovoltaic device) or a top-emitting electroluminescent device. For example, the transparent second electrode may include a material selected from the group consisting of a transparent conductive oxide (TCO), a transparent conductive organic layer, and a transparent thin metal layer. In some embodiments, the first electrode of the two-terminal device is substantially optically transparent. For example, the device may be a bottom-sensing photodetector (or a photovoltaic device) or a bottom-emitting electroluminescent device. For example, the transparent bottom electrode may include a material selected from the group consisting of a (TCO), a transparent conductive organic layer, and a transparent thin metal layer. In some embodiments, both the first and second electrodes of the two-terminal device are optically transparent.

In some embodiments the semiconductor layer of the two-terminal device comprises an organic semiconductor selected from the group consisting of PPV, MEH-PPV, P3HT, PTB7, PCPDTBT, PDDTT, PTZBTTT-BDT $PC_{60}BM$, $PC_{70}BM$, TPD, NPB and combinations thereof, wherein PPV is poly(p-phenylene-vinylene), MEH-PPV is Poly[2-methoxy-5-(2-ethylhexyloxy)-1,4-phenylenevinylene], P3HT is Poly(3-hexylthiophene-2,5-diyl), PTB7 is Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]], PCPDTBT is Poly[2,6-(4,4-bis-(2-ethylhexyl)-4H-cyclopenta [2,1-b;3,4-b']dithiophene)-alt-4,7(2,1,3-benzothiadiazole)], PDDTT is poly(5,7-bis(4-decanyl-2-thienyl)-thieno(3,4-b)diathiazolethiophene-2,5), $PC_{60}BM$ is (6,6)-phenyl-C61-butyric acid methyl ester, $PC_{70}BM$ is (6,6)-phenyl-C71-butyric acid methyl ester, TPD is N,N'-Bis(3-methylphenyl)-N,N'-diphenylbenzidine, NPB is N,N'-Di(1-naphthyl)-N,N'-diphenyl-(1,1'-biphenyl)-4,4'-diamine, and wherein PTZBTTT-BDT has the following structure:

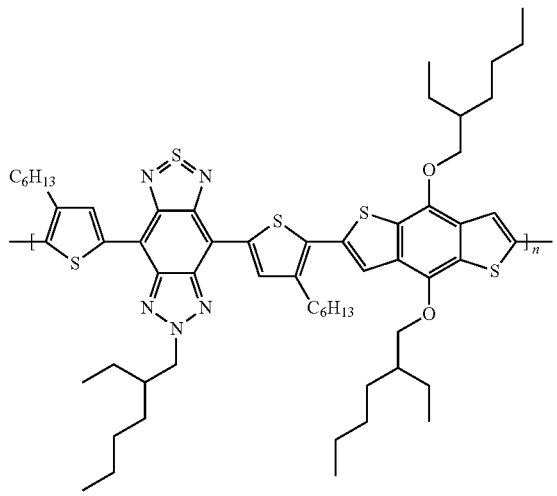

In some embodiments the semiconductor layer of the two-terminal device comprises an inorganic semiconductor selected from the group consisting of MoO, NiO, SiC, CuO, PbS, CuInSe, CuInS, CuInGaSe, CdSe, PbSe, and selenium.

The two-terminal devices provided herein are characterized in some embodiments by an Ion/Ioff ratio of at least 1000, wherein Ion and Ioff are currents detected when the device is "on" and "off" respectively.

In some embodiments the two-terminal device is a UV-detector that is incorporated into a portable electronic device and is configured to provide a UV index to a user.

In some embodiments the two-terminal device is an X-ray or high energy radiation detector, wherein the semiconductor layer comprises: (i) a first sublayer in contact with the I-layer, the first sub-layer comprising a material selected from the group consisting of an amorphous selenium, PbO, CdI, CdTe and HgI; and (ii) a second sublayer comprising a p-type semiconductor over the first sublayer.

In some embodiments the two-terminal device is a UV detector, wherein the first electrode comprises a metal selected from the group consisting of Ti, Ta, Zn, In, Sn, Ga, Zr, Y and an alloy comprising any of these metals; the I layer comprises an oxide of the metal or of the metals of the alloy of the first electrode; the p-type semiconductor layer comprises a material selected from the group consisting of TPD, NPB, polymers comprising TPD, polymers comprising NPB, polyfluorene polymers (PFO), MoO, NiO, NiN and SiC; and the second electrode is transparent and comprises a TCO or a transparent conductive polymer.

In some embodiments the two-terminal device is a visible light and/or IR detector or a photovoltaic device, wherein the first electrode comprises a metal selected from the group consisting of Ti, Ta, Zn, In, Sn, Ga and a metal alloy comprising any of these metals, the I layer comprises an oxide of the metal or of the metals of the alloy of the first electrode; the semiconductor layer comprises two sublayers wherein the first sublayer is in contact with the I-layer and comprises a material selected from the group consisting of PPV, MEHPPV, P3HT, PTB7, PCPDTBT, PTZBTTT-BDT, PDDTT, PCBM, CuO, PbS, CuInSe, CuInS, CuInGaSe, selenium, nanoparticles comprising PbS, PbSe, CdSe, CdS, and a blend comprising them; and the second sublayer comprises a p-type semiconductor configured for conducting holes and blocking electrons, and the second electrode is transparent and comprises a TCO, a conductive organic layer, or a thin layer of metal or alloy. In some implementations, PCBM and/or inorganic nanoparticles are blended into the p-type semiconductor, wherein PCBM is [6,6]-Phenyl $C_{61}$ butyric acid methyl ester In some embodiments the two-terminal device is a top-emitting electroluminescent device having a semiconductor layer comprising a first semiconductor sub-layer comprising quantum dots light emitter, and a second semiconductor sub-layer comprising a p-type semiconductor, wherein the first semiconductor sub-layer is in contact with an I-layer, and the second semiconductor sub-layer is in contact with the second electrode, wherein the second electrode is transparent.

In some embodiments the two-terminal device is a transparent electroluminescent device having a semiconductor layer comprising a first semiconductor sub-layer comprising a light emitter, and a second semiconductor sub-layer comprising a p-type semiconductor, wherein the first semiconductor sub-layer is in contact with an I-layer, and the second semiconductor sub-layer is in contact with the second electrode, wherein both the first and second electrodes are transparent.

In another aspect an array of two-terminal photosensing or light emission devices is provided, wherein each device comprises: a first electrode residing on a substrate and patterned to define the size of each device, wherein the first electrode comprises a layer of metal or metal alloy: an I-layer comprising an inorganic insulating or broad band semiconducting material residing on top of the first electrode, and aligned with the first electrode, wherein the inorganic insulating or broad band semiconducting material is a compound of the metal or metal alloy of the first electrode; a semiconductor layer residing over the I-layer; and an optically transparent second electrode residing over the semiconductor layer, wherein the I-layer is not shared by the individual devices of the array, and the semiconductor layer and the second electrodes are shared by the individual devices of the array. In some embodiments the semiconductor layer the semiconductor layer comprises at least two sub-layers, wherein the first semiconductor sub-layer is in contact with the I-layer, and is configured to generate charge under light illumination, or to generate light upon being injected with a charge, and wherein the second semiconductor sub-layer is in contact with the second electrode and comprises p-type semiconductor configured to conduct holes and block electrons.

In another aspect, an array of two-terminal photosensing or light emission devices is provided, wherein each device comprises: a first electrode residing on a substrate; an I-layer comprising an inorganic insulating or broad band semiconducting material residing on top of the first electrode; a semiconductor layer residing over the I-layer; and a second electrode residing over the semiconductor layer, wherein the I-layer, the semiconductor layer and the second electrode are shared by the individual devices of the array, and wherein at least one of the first and second electrodes is transparent. In some embodiments the semiconductor layer comprises at least two sublayers, and wherein the first semiconductor sublayer is in contact with the I-layer, and is configured to generate charge under light illumination, or to generate light upon being injected with a charge, wherein the second semiconductor sublayer is in contact with the second electrode and comprises p-type semiconductor configured to conduct holes and block electrons. In some embodiments the semiconductor layer comprises at least two sublayers, and wherein the first semiconductor sublayer is in contact with the I-layer, and is configured to generate charge under light illumination, or to generate light upon being injected with a charge, wherein the second semiconductor sublayer is in contact with the second electrode and comprises p-type semiconductor configured to conduct holes and block electrons.

In another aspect a method of forming a two terminal device on a substrate is provided. The method may include in some embodiments: (a) forming a first electrode on a substrate, wherein the first electrode comprises a layer of metal or metal alloy; (b) oxidizing the layer of metal to form a self-aligned layer of a metal compound on the metal layer; (c) forming a layer of semiconductor or a stack of semiconductor layers over the layer of metal compound; and (d) forming a second electrode over the semiconductor layer or the stack.

In some embodiments a method of forming a two terminal device on a substrate includes: (a) forming a first electrode on a substrate, wherein the first electrode comprises a layer of conductive material; (b) forming a sacrificial metal-containing layer (e.g., a metal salt and/or an organometallic compound) over the layer of metal; (c) treating the sacrificial layer to convert it to a layer comprising a metal compound (e.g., metal oxide, metal nitride, metal-C—H—O, and the like) suitable for an I-layer; (d) forming a layer of semiconductor or a stack of semiconductor layers over the layer of metal compound; and (e) forming a second electrode over the semiconductor layer or the stack. It is noted that the metal of the first electrode and the metal of the I-layer may be the same or different metals.

In another aspect a method of forming an array of photosensing or light emitting devices on a substrate is provided. The method includes in some embodiments: (a) forming a patterned first electrode on a substrate which defines individual elements of the array; (b) forming an I-layer comprising an inorganic insulating or a broad band semiconducting material over the first electrode; (c) forming a semiconductor layer or a stack of semiconductor layers over the I-layer such that the semiconductor layer or the stack is shared between the individual devices in an array; and (d) forming a second electrode over the semiconductor layer, wherein the second electrodes are connected between neighboring pixel elements, wherein at least one of the first and second electrodes is transparent.

The amount of patterning during fabrication can be substantially reduced by using the methods and device structures provided herein.

These and other features and advantages of the invention will be described in more detail below with reference to the associated drawings.

DETAILED DESCRIPTION OF A PREFERRED EMBODIMENT

Introduction, Terminology and Electronic Characteristics

Figure 1A:
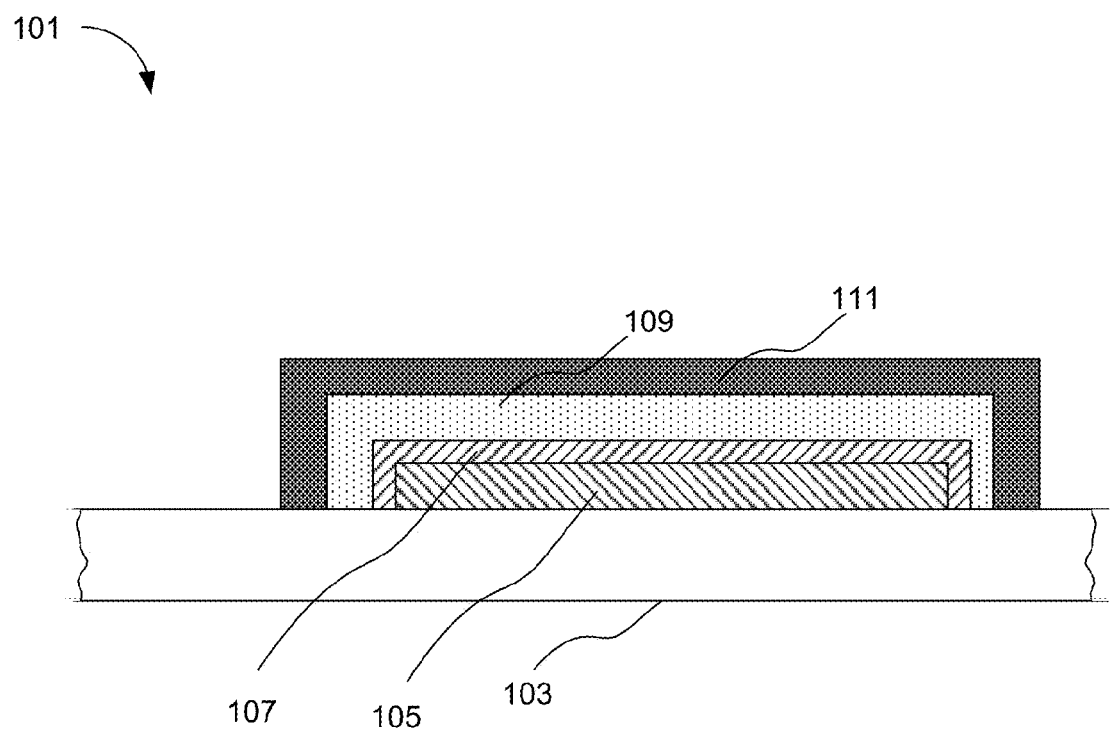
FIG. 1A presents a cross-sectional view of an electronic device in accordance with some embodiments of the present invention.

As indicated, currently used fabrication methods of electronic devices (e.g., of photodetectors, photovoltaic devices, and electroluminescent devices), employ expensive and laborious processes that often involve multiple patterning steps. In some embodiments, electronic device structures that can be fabricated with a reduced number of patterning steps are provided. In some embodiments the layers of material and the corresponding patterning are formed using self-aligning methods, in which an underlying layer is modified (e.g., oxidized) to form a layer that is aligned with the underlying layer and therefore does not require additional patterning process. The term "oxidation", as used herein, refers generally to an increase in the oxidation state (e.g., from 0 to +4), and is not limited to reactions with oxygen, but also includes other oxidation reactions, such as formation of nitrides, sulfides, selenides, and fluorides from metals.

Some embodiments of the invention employ liquid-phase processing at relatively low temperature as an alternative to costly and laborious deposition operations and photolithographic patterning at least for some of the components in the device structure, and particularly for the top electrode layer.

Some embodiments of the invention employ a layer of a semiconductor material spanning several electronic devices in an array. The use of such blanket semiconductor layer allows one to reduce the number of patterning steps in device fabrication. Further, some embodiments of the invention employ a top electrode layer that is unpatterned and that spans several devices in an array.

Several types of electronic devices can be fabricated using methods provided herein. These include photodetectors, photovoltaic devices and electroluminescent devices.

Photodetectors are sensors that produce an electrical output signal after they are irradiated. Irradiation is not limited to visible part of the spectrum and also includes X-ray irradiation, ultraviolet (UV) irradiation, infrared (IR) irradiation. X-ray, UV, V is, and IR photodetectors are provided herein. Photoconductors and photodiodes are examples of photodetectors.

Photovoltaic devices produce an electrical output signal upon irradiation that can be used to power other appliances.

Electroluminescent devices emit light in response to an electrical signal and are also referred herein to as light emitting devices (LEDs). UV, V is, and IR LEDs can be formed using provided methods.

The electronic devices provided herein in some embodiments include at least four layers: (a) a first electrode (functioning as a cathode) residing on a substrate, wherein the first electrode comprises a layer of metal (wherein the term "metal" includes pure metals and metal alloys); (b) an I-layer comprising an inorganic insulating or broad band semiconducting material residing on top of the first electrode, and aligned with the first electrode, wherein the inorganic insulating or broad band semiconducting material is a compound of the metal of the first electrode; (c) a semiconductor layer residing over the I-layer and comprising an organic semiconductor, an inorganic semiconductor or an organic/inorganic blend, wherein the semiconductor layer is preferably p-type; and (d) a second electrode (functioning as an anode) residing over the semiconductor layer, the second electrode comprising a layer of a conductive material.

Other layers can be optionally included into the provided film stack, e.g., to enhance light absorption in photodetectors, or to modulate the emission wavelength in LEDs. For example, the semiconductor layer may include two sub-layers, a first sub-layer configured for light emission or photodetection, and a second sublayer comprising a p-type semiconductor material.

As used herein, the term "over" when used to describe relative position of the layers means that one layer at least partially overlies another layer, but the two layers need not necessarily be in direct contact (e.g., there may be a another layer inserted between them). In other embodiments, the I-layer need not necessarily be self-aligned with the bottom electrode and need not be made from the same metal as the bottom electrode. For example, the I-layer, may be a layer of metal oxide, metal nitride, metal oxynitride, metal-O—C—H and the like, wherein the layer is continuous and may be shared by a plurality of devices (e.g., corresponding to individual pixels) in an array. Such layers may be prepared by coating the substrate containing patterned bottom electrodes with a precursor containing a metal (e.g., a metal salt or an organometallic compound), followed by treatment to form the I-layer material, e.g., by annealing in a suitable environment.

In general the semiconductor layer can be organic (the term also including organometallic), inorganic or be in the form of an organic/inorganic blend or stack of individual organic and inorganic layers. The organic semiconductor may include one or more organic semiconductor molecules in a blend or in a stack of individual layers. The inorganic semiconductor may similarly include several inorganic molecules in a blend or in a stack of individual layers. In some embodiments the semiconductor layer includes organometallic compounds or inorganic nanoparticles.

Materials are selected for the electronic devices such as to provide the necessary function. Generally, the materials of the first and second electrodes are selected such that the difference between work functions of the two materials is greater than 0.3 eV, e.g., the anode has a work function that is at least 0.3 eV greater than the work function of the cathode in absolute value. For example, in photodetectors which include titanium as a cathode (with a work function of −4.0 eV) and an indium tin oxide (ITO) as an anode (with the work function of −4.7 eV) the difference in the work function is 0.7 eV in absolute value. In LEDs, the materials are selected such that the work function difference between the anode and the cathode is preferably at least about 1 eV, e.g., between about 2-2.5 eV. For example, tantalum, tantalum-aluminum, or tantalum-zirconium alloy can be used as a cathode in an LED, while a conducting polymer having high work function such as PEDOT (work function in a range of about 5.1-5.3 eV) can be used as an anode. The described electronic devices are characterized by asymmetrical current-voltage (I-V) curve. In other words, a substantially higher current is observed in a forward bias (higher potential applied to anode) than in a reverse bias in their I-V curves. It is also noted that not all of the materials of the electrode need to have the required difference in the work function, but only the materials that directly participate in charge transfer are relevant for this purpose. For example a titanium-coated ITO electrode, where titanium is in contact with the titanium oxide I-layer will be characterized by the work function of titanium rather than ITO. Therefore, for the bottom and top electrodes, the materials that are in direct contact with the I-layer and the semiconductor layer define the work functions of electrodes. It is also noted that the work function of certain materials, e.g., ITO can be tuned in a relatively broad range by changing, e.g., oxygen content, thereby allowing tuning of the required work function difference between the electrodes.

Further, the material for the Mayer is selected such that its band gap is at least about 2.5 eV. Examples of such materials include metal oxides, metal sulfides, metal fluorides, etc. The band gap of the semiconductor layer overlying the I-layer is preferably smaller than the band gap of the underlying I-layer material.

In some embodiments, the second (top) electrode is substantially optically transparent. Optical transparency is determined by the type of radiation that the device is designed to sense or emit. For example, if the device is a UV-detector the top electrode is preferably substantially transparent to UV radiation. If the device is designed to sense certain visible light wavelengths, the top electrode is substantially transparent to these wavelengths. Examples of optically transparent electrodes include transparent oxides, such as indium-tin-oxide (ITO), indium-zinc-oxide (IZO), and aluminum-zinc-oxide (AZO) and thin layers of conductive polymers such as PEDOT (Poly(3,4-ethylenedioxythiophene))-based, PANI (polyaniline)-based and) PPY (polypyrrole)-based polymers. In some embodiments thin layers containing metals are used. For example, thin Ag/AgO electrode can be used as an optically transparent anode.

In some embodiments one or more layers of the electronic device are deposited by liquid-phase processing. "Liquid-phase processing" refers to formation of material from a liquid-containing phase material, such as a solution, a suspension, a sol-gel, or a melt. The liquid phase may contain either the material to be deposited or its precursor.

The deposition of material by liquid phase processing typically involves delivering the liquid-phase material containing the material or its precursor to an underlying layer or a substrate of the device structure. In some embodiments, the liquid phase material is delivered selectively to the final positions where it is to be located in the electronic devices. In other embodiments, it is delivered more broadly over a wider area of the underlying substrate and then selectively removed by a patterning process or other process. After deposition (whether selective or non-selective), the deposited liquid phase material may be modified (e.g., cooled, heated, reacted, etc.) to produce a conductive layer or insulating/semiconducting layer for an electronic device.

The liquid phase material can be delivered by a variety of methods known by those of skill in the art. These include immersion, coating, droplet based printing (e.g., ink jet printing), gravure printing, silkscreen printing, thermal transfer printing, offset printing etc. Coating methods include spin-coating, spray-coating, bar-coating, dip-coating, slot coating and the like.

As indicated, the liquid phase material may be delivered in a patterned manner (e.g., printing a pattern), so that no additional patterning is required after material is deposited. Such deposition reduces the necessity of costly and laborious photolithographic patterning.

After the liquid phase material has been delivered to the partially fabricated device, the material can be formed in a number of ways. These include solvent evaporation, cooling or heating of the liquid phase, chemically or electrochemically treating a precursor in the liquid phase, treating a material or its precursor in a liquid by irradiation or high temperature to cause material precipitation. Specific examples include, evaporation of solvent from a printed solution of an ink, electroplating a metal, depositing a metal by electroless deposition, depositing material by cooling a melt, etc.

In some embodiments, it is preferable to use liquid-phase deposition for the deposition of the top electrode of the electronic device (i.e., the electrode further removed from the underlying substrate), while the bottom electrode may be formed by conventional methods. In some embodiments, liquid-phase deposition is used to deposit a semiconductor layer over an I-layer. In each of these embodiments, certain embodiments fabricate at least one of the liquid phase layers by a printing/coating process.

Two-Terminal Electronic Device Structure

An example of a two-terminal electronic device structure, according to one embodiment of the present invention is shown in FIG. 1A. In this embodiment, the electronic device is a four-layer device, with an I-layer and a semiconductor layer residing between two layers of conductive materials. It is understood, that in other embodiments electronic devices may include additional layers, or any of the three layers may comprise two or more sub-layers forming a stack. A cross-sectional view of an electronic device (e.g., a photodetector or a photovoltaic device) is presented. Electroluminescent devices have similar structures and also typically include an additional layer of electroluminescent material disposed over the I-layer, also referred to here as the first semiconductor sub-layer.

The device 101 resides on a substrate 103 and includes a first electrode layer 105, an I-layer 107, a semiconductor layer 109 and a second electrode layer 111. Electrical contacts (not shown) connect the electrodes 105 and 111 to external circuit, or other components above or below. For example, in an image array device the bottom electrode 105 is connected to a readout circuit underneath through a via-hole in a planarization/passivation insulator layer.

In photovoltaic applications such as in solar cell, the two terminals of the device are connected to a low impedance load such as a lamp. The device is operating with its internal potential created by the p-i-n structure and flows current through the external load. In a photodetector, operation can be conducted at a nearly zero bias similarly to a photovoltaic cell, or at a reverse bias (connecting the anode (electrode at the p-layer side) to a voltage bias with low potential and n-layer side (cathode) with a higher potential). The photo-current can be probed with a current meter in the loop or a voltage drop can be read on a resistive load connected in the loop. For an LED, the anode is biased with a positive voltage (higher potential to anode). When the external biasing voltage is higher than the internal potential created by the P-I-N structure in the LED, a current flows through as in a non-symmetric switch diode.

The sizes of devices can vary depending on application and can range from about a few microns in high pixel density image or display array to a few centimeters in photovoltaic devices. In some embodiments macroscopic photodetectors or light emitting diodes (between about a few microns to a few centimeters) are provided as single structures or are incorporated into an array. In other embodiments, arrays of small electronic devices with pixel elements sizes of between about a few microns to a few millimeters are provided.

Substrate

The substrate 101 is typically made of an insulating material that does not allow shorting of multiple electronic devices residing on such substrate (e.g., as a matrix of electronic devices). In certain embodiments, the substrate may include a conductive material (e.g., a metal), but in such cases a protective insulating coating is typically employed to prevent shorting between neighboring elements or circuits. Suitable substrate materials include glasses, crystalline wafers, polymeric materials (e.g., plastic sheets) and stainless steel foils. For example, polyethyleneterephthalate (PET) can be used. Substrates can be either rigid or flexible. In certain embodiments substrates have a melting point or glass transition point (Tg) lower than about 30° C. or even about 200° C. The use of such substrates is possible when fabrication process with process temperature below Tg or melting point of a substrate is adopted, as disclosed in some embodiments in this invention. In certain embodiments, device 101 is constructed on top of other circuits underneath. That is, device 101 is stacked on top of another circuit layer on top of substrate 103.

First Electrode

The first electrode 105 is also sometimes called the "bottom" electrode to indicate that the electrode is closest to an underlying substrate. The first electrode functions as a cathode in the provided electronic devices. Typically, though not necessarily, it is formed directly on the underlying substrate. In some cases, another circuit can be inserted between the substrate 103 and the first electrode 105. The first electrode may include any suitable conductive metal (wherein the term "metal" includes metal alloys).

A variety of metals can be used as first electrode layers. For example, metals such as Ti, Ta, Al, Ga, In, Nb, Hf, Sn, Zn, Zr, Cu, Sm, Cd, Mn, Fe, Cr, Ni and Y can be employed. Alloys of these metals with each other, such as TaAl, TaZr, TiZr and TiAl, or with other metals are also suitable conducting materials for the first electrode. In selected embodiments alkaline-earth metals, such as Ca, Ba, Sr and Mg can be used. Rare earth metals, such as Sm and other lanthanides are also suitable. In one embodiment the metal of the first electrode includes one or more of Ti, Ta, Zn, In, Sn, Ga, Hf, Zr, Cd, V, and Nb. For example Ti, Ta, Zn, In, Sn, and Ga are preferred in some embodiments. Because the first electrode functions as a cathode, metals with a relatively low work function are typically selected. In some embodiments the work function of the first electrode is less than about 4.5 eV (for a photodetector or a photovoltaic device) or less than about 3.5 eV (for an electroluminescent device).

The first electrode 105 may be a single layer of material or may be formed of several layers forming a stack. The thickness of the first electrode is not critical and can be from hundreds of Angstroms to hundreds of microns or thicker. In certain applications transmission to radiation wavelength is desirable for bottom electrode, for example, in a visible-infrared photodetector array with light incidence from the bottom substrate side or for a light emitting diode arrays with light emission from bottom substrate side. In these cases, electrode 105 can be made with a thin metal layer, or a thin metal on top of a conducting metal oxide (such as $In_2O_3$, $SnO_2$, or In—Sn—O) layer, that is transparent to the desired radiation. In these embodiments the bottom substrate may also be transparent to the desired radiation.

I-Layer

The I-layer 107 in the electronic devices of this invention includes an inorganic component which preferably has a band gap of at least about 2.5 eV. In many cases, the I-layer is entirely inorganic, with no organic component. In other embodiments, an inorganic/organic blend or an organometallic compound can be used in the I-layer. The I-layer material is also referred to as an insulator or a broad band semiconductor, and includes, in some embodiments, stoichiometric and non-stoichiometric oxides, nitrides, chalcogenides (e.g., sulfides) and halides of metals. In some embodiments, the I-layer includes a compound of the same metal that is used in the first electrode. For example, if the first electrode is made of tantalum, the I-layer may be made of tantalum oxide, tantalum nitride, tantalum sulfide, tantalum selenide and the like. Composite oxides and inorganic ceramic nanocomposites comprising single or multiple metal anions, such as Ta—Al—O, Ta—Zr—O, Sr—Ta—O, Sr—Ti—O, Zr—Ti—O, Ca—Ti—O, Mg—Ti—O, $Y_xBa_yO_z$ (e.g., $YBaO_3$) and $Sm_xSn_yO_z$ (e.g., $Sm_2Sn_2O_7$) are also suitable. They can be formed by surface oxidation from corresponding metal alloys. In some embodiments, the I-layer includes a compound of Ti, Ta, Al, Ga, In, Nb, Hf, Sn, Zn, Zr, W, Sr, Cu, Sm, Cd, Mn, Fe, Cr, Ni, Nb or Y or their combinations Compounds of alkaline-earth metals, such as Ca, Sr, Ba, and Mg are used in some embodiments.

Various techniques may be employed to prepare the I-layer 107. In some embodiments the I-layer is formed by converting a portion of an underlying electrode layer 105 into a desired metal compound (e.g., oxide, nitride, chalcogenide, or halide). In this case the I-layer is formed in a self-aligned manner on top of the first electrode thereby eliminating the need of additional patterning. Examples of such convertion processes includes anodization, surface oxidation at an elevated temperature under oxygen and/or water vapor environment, plasma treatment in oxygen presence, surface treatment in $H_2S$ vapor environment and their combinations. Similar processes have been disclosed in U.S. Pat. No. 8,222,077 which is herein incorporated by reference in its entirety. In another embodiment, a sacrificial layer of an organometallic compound or any metal-containing precursor (e.g., metal salt) is formed on top of the first electrode and is then converted to an I-layer, e.g. at an elevated temperature under desired environment, such as in proper $N_2$, Ar, $O_2$, or $H_2O$ ambient. It is noteworthy that many of the processes of I-layer formation can be carried out at temperature below 300° C., and therefore an organic substrate can be used.

The thickness of an I-layer is an important parameter that may influence the performance of the electronic device. The thicknesses may range depending on specific applications. For UV, visible and infrared photodetectors and light emitters, the thickness of the I-layer is typically in the $10$-$10^2$ nm range. In direct X-ray photodetectors, I-layer thicknesses of greater than $10^2$ nm can be used.

Of course, the actual thickness depends in part on the type of material employed as the I-layer and, especially on its dielectric constant or carrier density generated by mixed-valences of metals that are involved and oxygen vacancies that exist. For some embodiments, larger photodetectors, photovoltaic devices, and LEDs with I-layers having thicknesses of greater than 100 nm may be desirable.

In some embodiments, particularly in those embodiments which employ organic layers as the semiconductor layer or an emission layer, the I-layer material further serves as a diffusion barrier between the electrode and the organic layer. In these embodiments materials having good barrier properties, such as metal nitrides (e.g., tantalum nitride and titanium nitride) are particularly preferred.

Semiconductor Layer

A semiconductor layer 109 resides over the I-layer 107, and in the embodiment depicted in FIG. 1A is in direct contact with the I-layer. In other embodiment one or more additional layers of material may be inserted between the I-layer and the semiconductor layer.

The semiconductor layer 107 typically includes a semiconductor material that has a band gap that is smaller than the band gap of the I-layer material. Although not limited, p-type semiconductors are preferred in devices with hetero junction structure. The semiconductor layer, in some embodiments, comprises a p-type inorganic semiconductor. Examples include Mo—O, Ni—O, V—O, Si—C, Cu—O, Zn—O—N, Cu—In—O, Cu—In—Ga—O, Pb—S, Pb—Se, Cu—In—Se, Cu—In—S, Cu—In—Ga—Se, Cu—In—Ga—S, Cd—S, Cd—Se, Cd—Te, Pb—S, Pb—Se, Pb—Te, Pb—Ta—O. The p-layer can be a single compound film, a blend film comprising multiple compounds or a stack of films with made with different compositions.

The semiconductor layer 109 can also be an organic semiconductor or a blend/composite film comprising an organic semiconductor binder with an inorganic or an organometallic molecule(s)/nanoparticle(s). The inorganic nanoparticles and/or molecules in the blend and/or composite can be the same compounds listed above in single phase, or they can be presented in multiple layers in core-shell structures. Examples of organometallic molecules suitable for layer 109 or as a component in blend/composite for layer 109 include M-phthalocyanine, M-Naphthalonitriles, M-porphyrin in which M=Cu, Sn, Zn, Pb) and their soluble derivatives. Their dimers, trimers and oligomers can also be used.

Examples of specific organic semiconductors as layer 109 or as binder component in blend film 109 include polyacetylene (PA) and its derivatives, polythiophene (PT) and its derivatives, such as poly(3-hexylthiophene) (P3HT), PTB7, PCPDTBT, PDDTT, poly(p-phenyl vinylene) (PPV) and its derivatives, such as poly[2-methoxy-5-(2'-ethylhexyloxy)-1,4-phenylenevinylene] (MEH-PPV), polypyrrole, ("PPY"), and its derivatives; poly(2,5-thienylenevinylene), ("PTV"), and its derivatives; poly(p-phenylene), ("PPP"), and its derivatives; polyflourene, ("PFO"), and its derivatives; polycarbazole and its derivatives; poly(1,6-heptadiyne); polyquinolene and semiconducting polyanilines (i.e. leucoemeraldine and/or the emeraldine base form). Other suitable semiconducting materials include anthracene, tetracene, pentacene, tris-(8-hydroxyquinoline)aluminum (Alq3), and other metal-ligand complexes and organometallic compounds. Of these materials, those which exhibit solubility in organic or aqueous solvents are preferred because of their processing advantages.

Examples of PPV derivatives which are soluble to common organic solvents include MEH-PPV (F. Wudl, P.-M. Allemand, G. Srdanov, Z. Ni and D. McBranch, in Materials for Nonlinear Optics: Chemical Perspectives, edited by S. R. Marder, J. E. Sohn and G. D. Stucky (The American Chemical Society, Washington D.C., 1991), p. 683.), poly (2-butyl-5-(2-ethyl-hexyl)-1,4-phenylenevinylene), ("BuEH-PPV") (M. A. Andersson, G. Yu, A. J. Heeger, Synth. Metals 85, 1275 (1997)), poly(2,5-bis(cholestanoxy)-1,4-phenylenevinylene, ("BCHA-PPV"). Examples of soluble PTs include poly(3-alkylthiophenes), (P3AT), wherein the alkyl side chains contain more than 4 carbons, such as from 5 to 30 carbons.

The semiconductor layer 109 can also be fabricated using donor/acceptor polyblends. These polyblends can be blends of semiconducting polymer/polymer, or blends of semiconducting polymer with suitable organic molecules, organometallic molecules, and/or inorganic molecules or inorganic nanoparticles. Examples for the donor of the donor/acceptor polyblends include but are not limited to the conjugated polymers (e.g., PPV, PT, PTV, and poly(p-phenylene)), and their soluble derivatives. Examples for the acceptors of the donor/acceptor polyblends include but are not limited to poly(cyanaophenylenevinylene) ("CN-PPV"), fullerene molecules such as $C_{60}$ and its functional derivatives, carbon nanotubes (CNT), graphenes and organic semiconductor molecules and organometallic molecules used heretofore in the art for photoreceptors or electron transport layers.

A variety of charge transfer compounds may be included in the semiconductor layer 109 (either alone or in a mixture with other semiconductor materials described above). Such charge transfer compounds include but are not limited to charge transport molecules comprising oxadiazole groups, such as 2-(4-biphenyl)-5-(4-tert-butylphenyl)-1,3,4-oxadiazole (PBD), and charge transport molecules comprising arylamine groups, such as 4,4'-bis[N-(1-naphthyl)-7V-phenylamino]biphenyl (NPB), and 4,4'-bis[N-(3-methylphenyl)-N-phenylamino]biphenyl (TPB). Soluble derivatives and oligomers comprising such molecular unit can also be used.

In general, the semiconductor layer 109 may comprise an organic semiconductor, an inorganic semiconductor, or a blend or composite. In some embodiments, the semiconductor layer 109 comprises a plurality of sub-layers, where different sub-layers may include different semiconductors. For example, sub-layers of organic and inorganic semiconductors may be stacked. In some embodiments, several organic semiconductor molecules are blended in one layer 109. In some embodiments, distinct sub-layers of different organic semiconductor molecules may be formed in a stack. In some embodiments, several inorganic semiconductor molecules are blended in one layer 109. In some embodiments, distinct sub-layers of different inorganic semiconductor molecules may be formed in a stack.

In addition to transferring charges, such semiconductors can also possess electro-optic effects, opto-electric effects or both. Electro-optic (sometimes also called electroluminescent) effect refers to electrons and holes that are injected from cathode and anode meeting and recombining to emit in the semiconductor layer, in the I-layer, or near the interface of the I- and semiconductor layer. Opto-electric effect refers to electrons and holes being generated under radiation with photon energy above energy gap of the I- and/or semiconductor layer that can be collected in external circuit connecting the bottom and top electrodes.

For photovoltaic cell, UV, visible and infrared photodetector, the thickness of the semiconductor layer can range from about 0.1 to about 1 µm. For electro-optic/electroluminescent device applications, the thickness of the semiconductor layer can be in a range of about 20-200 nm. The semiconductor layer can be deposited by any suitable method, including thermal deposition, sputter, eBeam, CVD, and atomic layer deposition. Liquid-phase processing (e.g., spin coating, slot/slit coating, screen printing) can be used as well. We note that in array applications comprising a matrix of such devices, a non-patterned continuous film can be used for the semiconductor layer 109. In contrast to photodetectors and photovoltaic devices made with inorganic crystalline semiconductor wafers, the thin film semiconductors disclosed in some embodiments of this invention are either purely amorphous, or polycrystalline with crystal grain size substantially smaller than the film thickness. The process adopted and the materials selected in the provided embodiments enables one to make photosensors and photovoltaic cells with sensing layer that is substantially thinner than the sensing layers used in crystalline wafers. Accordingly, even in high pixel count array devices the sensing layer does not need to be patterned in the provided embodiments (although patterning can be used if desired). These methods substantially save process costs and improve process yields.

Moreover, conventional photodetectors and photovoltaic cells that are made using inorganic covalent semiconductor wafers and films have relatively narrow sensing bandwidth that is typically smaller than 800 nm. For example the sensing wavelength range in conventional photodiodes and photovoltaic cells made using single crystal silicon, polycrystalline silicon, amorphous silicon, GaAs and InGaAs are 0.2-1 mm, 0.3-0.8 mm, 0.3-0.7 µm, 0.2-0.9 µm and 0.8-1.7 µm respectively. In contrast, organic semiconductors typically possess broader absorption band due to ~0.2 eV energy splitting and shift related to electron-lattice interaction. Further, solution-based processes that can be used in the embodiments provided herein enable forming blend films with multiple components having different absorption and photosensing profiles. Thus, photodetectors and photovoltaic cells in some embodiments can have broad range of photoresponse, such as greater than 1 µm. In some experimentally validated examples provided herein photodetectors with photoresponse from 0.3 µm to 2 µm and even greater was demonstrated. The detection range was thus greater than 1.7 µm.

In addition to blending semiconductors with multiple components with different energy gaps, photodetectors and photovoltaic cells with broad photoresponse range can also be made by using several sublayers of materials with different energy structure.

Second Electrode

In general, second electrode 111 can employ any conductive material that has a work function that is greater than the work function of the first electrode material. Preferably the work function of the second electrode material is at least 0.3 eV greater in absolute value than the work function of the first electrode material.

In some embodiments the material of the second electrode 111 is substantially optically transparent. Examples of optically transparent electrode materials include thin films of conductive polymers and transparent conductive metal oxides, such as indium-oxide, tin-oxide, aluminum-zinc-oxide, indium-zinc-oxide and indium-tin-oxide.

In certain embodiments, organic conductive materials, such as conductive polymers and oligomers are found to be particularly suitable. Conductive polythiophene derivatives, such as poly(3,4-ethylenedioxythiophene) (PEDOT), polypyrroles (PPY), polyanilines (PANI), and co-polymers thereof can be used. Conducting nanotubes, doped fullerene molecules, graphene molecules can also be used. In some embodiments blends of neutral conjugated polyfluorenes (PFs), PPVs and polythiophenes (PTs) and charge-transporting polythiophenes (e.g., doped polythiophenes), polyanilines and polypyrroles can be used in a top electrode 111.

Organic conductive materials often include dopants that increase their conductivity. These dopants may be organic or inorganic (e.g., such as those described above). Preferred organic dopants include charged polymers, such as poly (styrenesulphonate) (PSS), which is commonly used in PEDOT:PSS and PANI:PSS combinations. Other suitable inorganic dopants include certain metal oxides (e.g., $TiO_2$), dimethylsulfoxide (DMSO), and carbon black, which are commonly used in, for example, PPY:$TiO_2$, and PPY:Carbon black and PEDOT:DMSO combinations.

In some embodiments metal nanoparticles, such as silver and gold nanoparticles are used in the second electrode. These materials can be deposited by a liquid-phase processing method such as inkjet printing, screen printing, or slit coating.

According to some embodiments, precursor materials used for the second electrode layer are soluble in a polar or a non-polar solvent. Polar or non-polar organic solvents, such as alcohols (e.g., methanol), acetone or hydrocarbon solvents may be used to deliver the above mentioned materials using liquid-phase processing. Materials that are water-soluble or that are soluble in organic/aqueous solutions, such as aqueous alcohols are also used in some embodiments. Such liquid media may be used, in some embodiments, to form the first electrode and/or the I-layer when a liquid phase deposition process is employed.

The thickness of the second electrode, similarly to the thickness of the first electrode is not critical and can be from hundreds of Angstroms to hundreds of microns or thicker. For the applications requiring transparent top electrode, the thickness is often in 10 nm-1000 nm range. For the applications requiring high conductivity over large device size, for example in a module of photovoltaic cell array with bottom illumination, an opaque top electrode can be used with a thickness in 1-100 µm range.

Electronic Devices with Additional Layers

In some embodiments the structure of the device shown in FIG. 1A is modified and additional layers are included to tune the electronic performance of the device and/or to include a light-emitting layer.

Figure 1B:
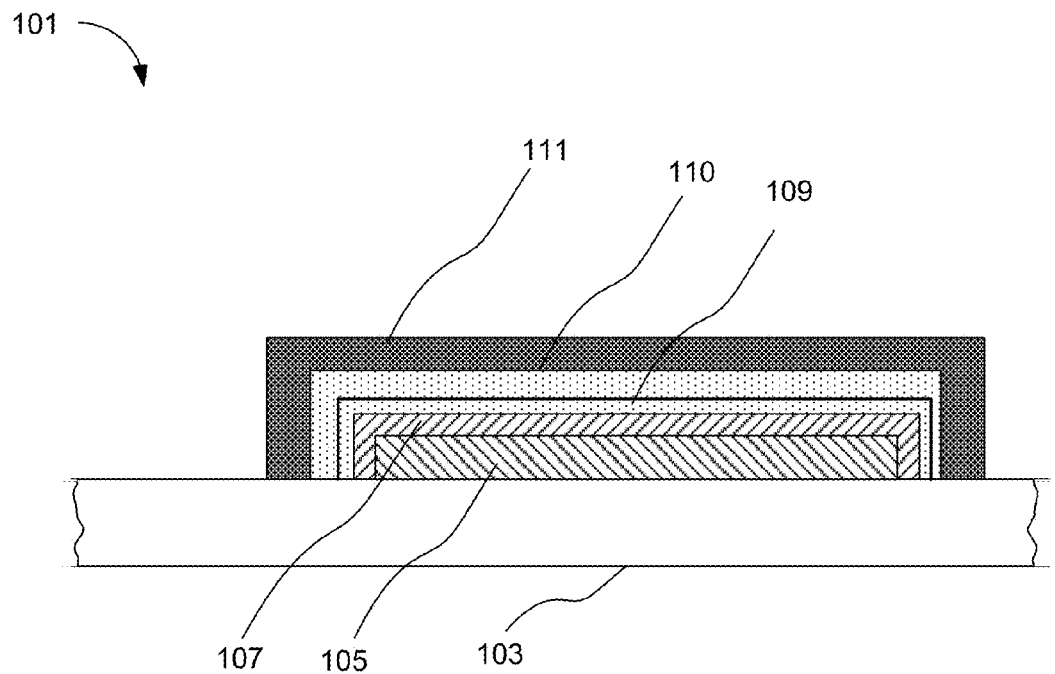
FIG. 1B presents a cross-sectional view of an electronic device in accordance with some embodiments of the present invention.

A structure containing 5 layers is shown in FIG. 1B. In one embodiment the structure shown in FIG. 1B, includes the same types of layers as described with reference to FIG. 1A, with the following difference. The semiconductor layer is split into two sub-layers: sub-layer 110 is an inorganic semiconductor layer, and sub-layer 109 is an organic semiconductor layer.

In yet another embodiment, an electroluminescent device can have a structure as shown in FIG. 1B, wherein layer 109 is an emission layer (also referred to as the first semiconductor sub-layer), and layer 110 is a p-type (hole-transport) semiconductor layer (also referred to as the second semiconductor sub-layer). The p-type semiconductor layer 110 may be organic, inorganic or a hybrid organic/inorganic material and may include multiple sub-layers or be in a composite form. Examples of suitable emission layer materials for layer 109 include small molecules (such as tris(8-hydroxy-quinolinato)aluminium (Alq3), bis(2-methyl-8-quinolinolate)-4-(phenylphenolato)aluminium (BAlq3), 9,10-di(naphth-2-yl)anthracene (AND), 1,3-bis(carbazol-9-yl)benzene (MCP), 4,4'-bis(carbazol-9-yl)biphenyl (CBP), 1,4-bis((9H-carbazol-9-yl)methyl)benzene (DCB), 2,2"2""-(1,3,5-Benzinetriiyl-tris(1-phenyl-1-H-benzimidazole (TPBi), perylene, rubrene, quinacridone and their soluble derivatives), semiconductor luminescent polymers (such as PPVs, poly(para phenylenes), polyfluorenes, poly(naphthalene vinylene)s and their derivatives) and blends of polymers with small molecules. Luminescent dopants can be added into emission layer 109 to improve emission efficiency and/or to tune emission profile and color. Examples of dopant for emission layer 109 include, BCM, 3-(2-benzothiazolyl)-7-(diethylamino)coumarin (Coumarin 6), 2,3,6,7-tetrahydro-1,1,7,7,-tetramethyl-1H, 5H,11H-10-(2-benzothiazolyl) (LT-E502) quinolizino[9,9a,1gh]coumarin (C545T), Tris(2-phenylpyridine)iridium(III), Ir(ppy)$_3$, Bis (2-phenylpyridine)(acetylacetonate)iridium(III), Ir(ppy)2 (acac), bis(1-phenylisoquinoline)(acetylacetonate)iridium (III), Ir(piq)2(acac), bis(3,5-difluoro-2-(2-pyridyl)phenyl-(2-carboxypyridyl)iridium(III) (IFIrPic), 4,4'-bis(9-ethyl-3-carbazovinylene)-1,1'-biphenyl (BCzVBi), 4-(dicyanomethylene)-2-methyl-6-julolidyl-9-enyl-4H-pyran (DCM). Layer 109 can be made by thermal deposition, or by coating or printing methods.

Emission layer 109 can also be made with inorganic semiconductor nanoparticles dispersed in an organic semiconductor binder (e.g., materials listed above) or with the inorganic nanoparticles passivated with a surfactant molecules/oligomers/polymers comprising a hole-transport group (such as para-methyl triphenylamine) and polar and/or anchor group (such as pentafluorophenole) that processable in a suspension and/or a solution form. Examples of such inorganic nanoparticles including CdSe, CdTe, CdS, ZnS, $Cd_{1-x}Zn_xS$, InP, $Cu_2O$, $Cu_{1-x}Zn_xO$, CuS, $C_{1-x}Zn_xS$ and their combinations in core-shell form or in blend form.

In direct X-ray or high energy radiation detectors, a thick non-doped or low-doped semiconductor layer (first semiconductor sub-layer 109) containing elements with large atomic weight can be inserted between the I-layer 107 and the p-type semiconductor layer 110. Examples of the materials suitable for such thick semiconductor layer include amorphous selenium, PbO, CdI and HgI. Selenium layer may be in an amorphous form, while the PbO, CdI and HgI compound materials may be in crystalline form. Thickness of such thick semiconductor layer is often in $10$-$10^2$ micron range and high thickness is needed to optimize the carrier generation and collection efficiency. Such detectors are biased in some embodiments in 30-300 V range to achieve optimized carrier collection efficiency and special imaging resolution. The I-layer materials, as previously described, such as ZnO, $TiO_2$, $Ta_2O_5$ can be used for these applications with thickness of ~100 nm, while MoO, NPB and PPV can be used for the p-type semiconductor layer (second semiconductor sub-layer) for collecting holes and blocking electrons.

Arrays of Electronic Devices

In some embodiments, arrays of electronic devices are provided on a substrate. In some embodiments individual devices in an array correspond to individual pixels, although in other embodiments groups of individual devices in an array may correspond to a single pixel.

Figure 2A:
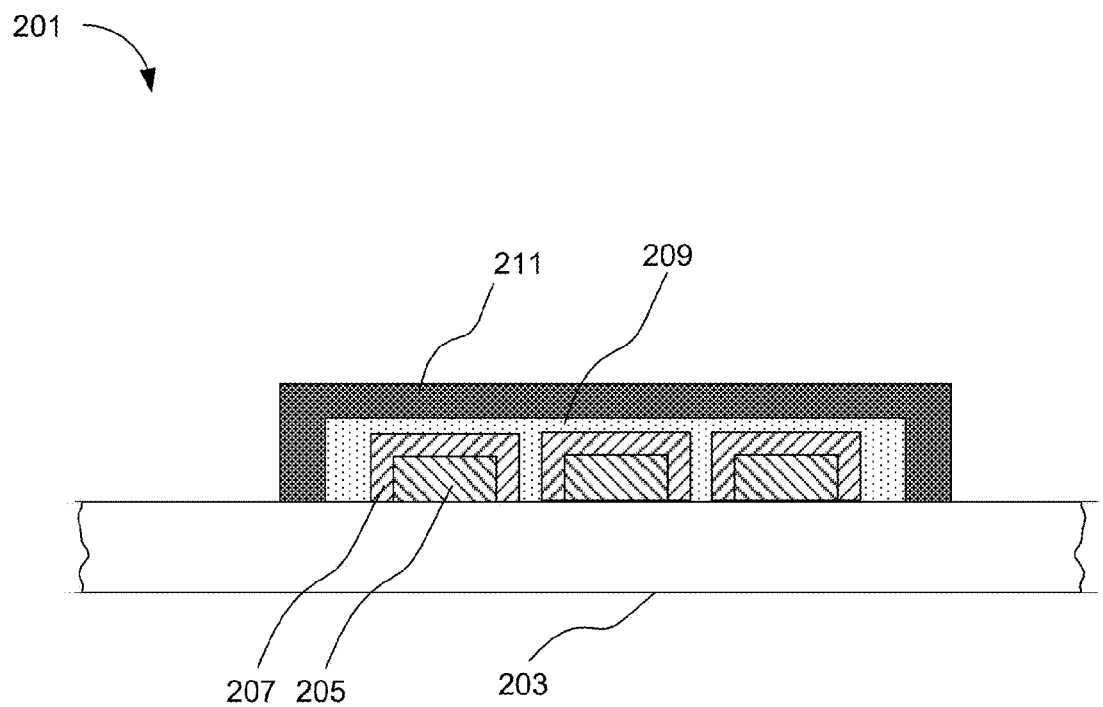
FIG. 2A presents a schematic cross-sectional view of an array of electronic devices in accordance with an embodiment of the present invention.

An embodiment illustrated in FIG. 2A illustrates a schematic presentation of such an array 201, where a plurality of electronic devices (e.g., photodetectors, photovoltaic devices or LEDs) is disposed on a substrate 203. In the depicted embodiment, the first electrode layer 205 is patterned to define the individual devices. The I-layer 207 is formed in a self-aligned manner with the underlying first electrode layer 205, and therefore does not require additional patterning. The semiconductor layer 207 can be deposited without patterning over the plurality of devices. Organic and inorganic semiconductors, preferably of p-type, as described above can be used for this layer. The second electrode layer 211 is also deposited without patterning and spans a plurality of devices.

In this embodiment the thickness of the semiconductor layer is smaller than the space between neighboring electrodes 205. Therefore the carrier conduction along y-direction is substantially greater than in an x-direction. Typical thickness of the semiconductor layer is 30-300 nm in LED devices, 100-1000 nm in photovoltaic and photodetector array devices. The ratio between the thickness of semiconductor layer and the space between neighboring bottom (first) electrodes is typically smaller than 0.5, preferably smaller than 0.35.

For arrays with emission or light illumination through bottom electrode 205, transparent and/or semitransparent conductive film is selected for electrode 205, wherein the transparency refers to transparency to the wavelength of interest. For such bottom-sensing or bottom-emitting devices, the top electrode 211 does not need to be transparent. On the other hand, if emission or light illumination is arranged through top electrode 211, transparent and/or semitransparent conductive film is selected for the electrode 211, where transparency refers to the wavelength of interest. When both top and bottom electrodes are transparent, transparent displays or image arrays can be formed.

In some embodiments the concept is extended by stacking such two devices together for additional integration of function. For example, by stacking a blue LED array on top of yellow LED array, one could form a light emitting array with emission covering entire visible spectrum, from 400 nm to 700 nm. By stacking an infrared sensor detector array on top of an LED array, one could convert the incident infrared image into a visible light image. When the electrode layer shared by the two arrays is thin enough (typically 0.001-0.1 times of the space between two neighboring bottom electrodes 205), such stacked device arrays with multiple functions can be made with only the bottom electrode 205 being patterned. Such array devices can thus be made with simple manufacturing process and high yield.

Thus, functional electronic devices and array devices are built with only one patterning operation for the first electrode layer, in the described embodiment. In alternative embodiments the semiconductor layer and/or the second electrode layer can be patterned.

Figure 2B:
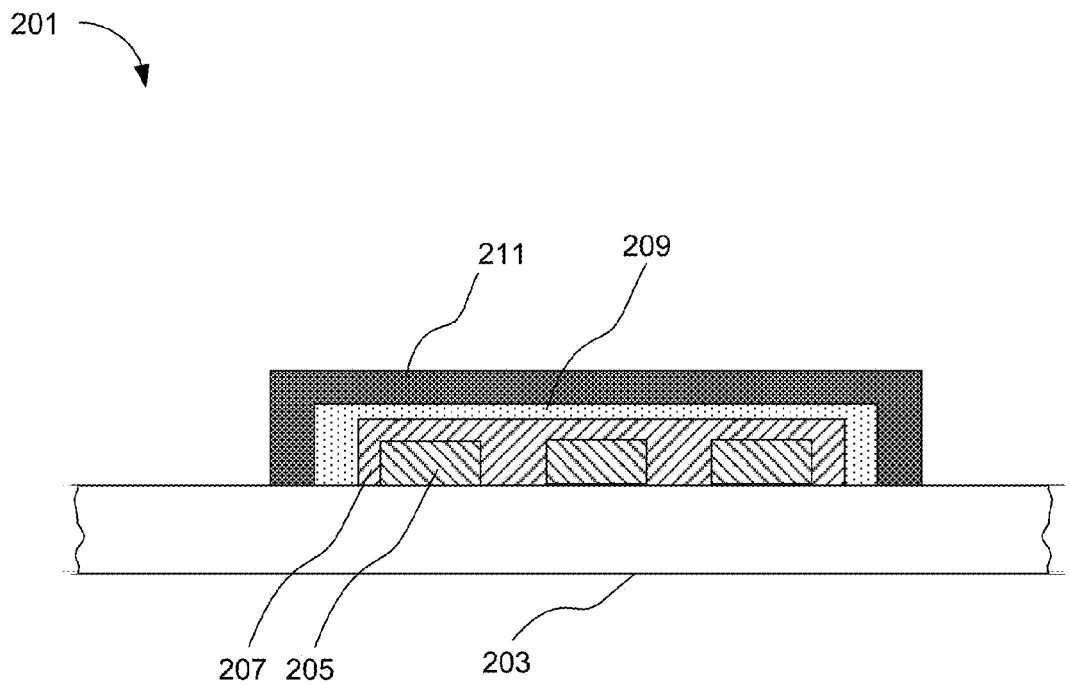
FIG. 2B presents a schematic cross-sectional view of an array of electronic devices in accordance with an embodiment of the present invention.

FIG. 2B illustrates another embodiment of an array of devices on a substrate. In this embodiment the difference from the structure illustrated by FIG. 2A is that the I-layer 207 is not patterned and is shared by several devices. Thus, in this embodiment, the only layer that is patterned is the first electrode layer 205. The continuous I-layer as shown in FIG. 2B can be used, for example, in a device that is prepared as follows. The first electrode 203 is deposited and patterned; then a sacrificial metal-containing precursor layer is deposited, e.g., by spin coating or bar coating over a plurality of first electrodes. Then, the sacrificial layer is treated to produce an I-layer 207 (e.g., to produce a metal oxide, nitride, carbide, oxynitride, metal-C—H—O, etc.) that does not need to be patterned. An unpatterned semiconductor layer 209 is deposited over the unpatterned I-layer, followed by deposition of an unpatterned second electrode 211. Of course, in other embodiments, the I-layer may be patterned after deposition (if it is deposited from a sacrificial layer) to be aligned with each two-terminal device.

Methods of Fabrication of the Two-Terminal Electronic Devices

As mentioned, a variety of methods can be used to form electronic devices provided herein.

Figure 3:
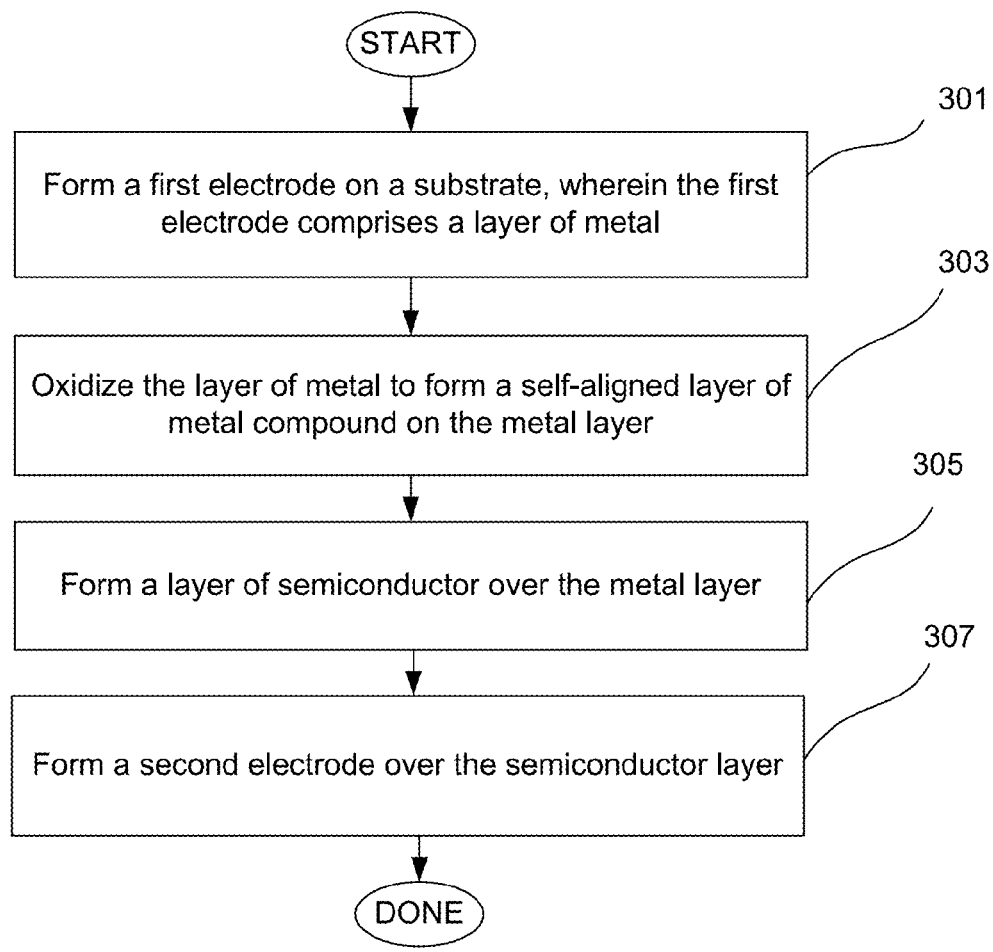
FIG. 3 is a process flow diagram for a process of fabricating an electronic device in accordance with some embodiments of the present invention.

One example of a fabrication method of a two-terminal electronic device in accordance with certain embodiments of the invention is illustrated in FIG. 3. This example refers to an electronic device that has an I-layer formed by modification of an underlying layer. For example, in this method the top portion of the first electrode may be modified to thereby form a metal/metal oxide, metal/metal nitride, metal/metal sulfide, metal/metal selenide or a metal/metal fluoride interface. Such sequence is superior to other methods since it minimizes the amount of laborious patterning steps conventionally required for electronic device fabrication. Preferably, according to the process flow diagram shown in FIG. 3, only the bottom electrode layer may need to be patterned, while the I-layer is formed conformally over the patterned bottom layer, and the semiconductor layer, and the top electrode layer is deposited as a blanket layer over several electronic devices, thereby remaining unpatterned.

The electronic device disclosed in provided embodiments with a pinhole-free I-layer between the bottom electrode and the semiconductor layer also has an advantage of eliminating leaking or shorting in the electronic device due to a robust coverage by the I-layer. This feature makes the devices unique over conventional devices especially for array devices comprising a large number of sensor or display elements.

Formation of a Bottom Electrode

Referring to FIG. 3, a layer of a first conductive material (metal) is deposited onto a substrate in the first operation 301. A variety of deposition methods can be used. These include PVD methods, such as sputtering, evaporation (including thermal evaporation, electron beam evaporation, sputter and the like), and photo-organic deposition methods (PODM). In selected embodiments electroplating and electroless deposition methods can be used, where appropriate. In other embodiments, printing can be used. For example, a variety of metals, such as Ti, Ta, Al etc. can be thermally deposited; certain metals, such as Ni can be electroplated or electrolessly deposited; while some metals, such as Ni can be printed on a substrate.

If necessary, the conductive layer deposited on a substrate is patterned using conventional patterning methods (e.g., lithography techniques), and an I-layer is formed over at least a portion of the first conductive layer in the following operation 303, where a portion of metal is oxidized. Several oxidation methods can be used to form the I-layer material, such as metal oxide, metal nitride, metal sulfide, metal-selenide, metal chalcogenide or metal halide. In some embodiments, a portion of the first electrode can be modified to form an insulator layer by, for example, chemical (thermal), plasma or electrochemical oxidative treatment. According to some embodiments, an upper portion of the first electrode metal layer can be anodized to form metal oxide.

Anodization

Anodization is a particularly suitable technique, since it conformally covers the first electrode metal layer with a thin layer of metal oxide, typically in a self-limiting fashion.

The anodization operation is typically performed by immersing a partially fabricated device structure into an anodizing solution, wherein the conductive layer of first electrode is connected to an anodizing potential source. The anodizing solution typically includes an aqueous solution of an acid, such as phosphoric acid, boric acid, or citric acid. It was discovered that a salt (such as a tartrate, a citrate or a phosphate) when used instead of an acid leads to improved anodization. In some embodiments anodizing solution may also contain ionic surfactants. According to some examples, after an anodizing potential has been applied for about an hour, a thin, pinhole-free layer of metal oxide is formed on the surface of the substrate.

When anodization is performed on a patterned metal layer which has electrically isolated portions of metal, in order to form metal oxide over these electrically isolated portions, they need to be electrically connected. Typically a temporary removable conducting material such as silver paste is applied to the patterned metal layer of the first electrode before anodization is performed, and is removed after anodization is complete by washing the silver with a solvent, such as propyl acetate. Anodization typically results in formation of metal oxide over the entire surface of the patterned metal layer, unless it was intentionally protected. In some embodiments, intentional protection of a portion of bottom electrode metal layer, may be used to form a via. Such a via may be used for connecting bottom electrode to a circuit. Certain polymers can be used as the protection pattern during anodization and then be stripped off to form the via hole through the oxide layer. Such via holes may be used for contact pads or connection to the bottom metal electrodes when needed.

Chemical Oxidation

Other methods of forming the I-layer by oxidizing the upper portion of first electrode may be used. For example, chemical modification or modification by a plasma treatment can be used. In some embodiments, metal oxides, sulfides, oxide-nitrides or nitrides may be formed by treating the underlying metal layer with an appropriate chemical, e.g. $O_2$, $H_2S$, $N_2O$, $N_2$ or $NH_3$. In some embodiments, thermal $O_2$ oxidation or oxide formation by a chemical vapor treatment may be used. For example, a portion of a titanium layer can be thermally oxidized in $O_2$ atmosphere to form dense, pinhole-free titanium oxide. In other cases $H_2O$ vapor may be used as an oxidant to form an oxide. Chemical treatment in some cases may be performed by a mild solution-based process and does not necessarily involve high-temperature treatment. For example the partially fabricated substrate can be immersed into a solution saturated with $H_2S$ or $CS_2$ used to form metal sulfides. In other embodiments, the metal may be treated with a solution of hydrogen peroxide to form a layer of oxide. In some embodiments, formation of metal nitrides such as tantalum or titanium nitrides is preferred because these materials can function as diffusion barriers between the bottom metal electrode 301 and the semiconductor layer 305 above. In some embodiments, oxidation of metal involves formation of metal halide layer from an underlying metal layer by a reaction with a halogen source. For example metal fluoride layers can be formed by treating the metal with $CF_4$ or $SF_6$, as a fluoride source.

In certain applications when transparent bottom electrode 301 is desired, a transparent electrode (such as conductive In—O, Sn—O, In—Sn—O, Al—Zn—O) can be used. A thin metal layer (for example, Ti, Ta, Hf, Zr) is then formed on top and then can be oxidized completely to form the metal compound layer 303.

Plasma Treatment

In some cases, the chemical oxidation reaction may be plasma assisted. For example, metal oxides, can be formed by exposing metal to a plasma with an oxygen source, e.g. $O_2$. In one example tantalum/aluminum alloy oxide I-layer was prepared by exposing aluminum bottom electrode layer to an $O_2$ plasma. Metal nitrides can be formed by exposing the metal to a nitrogen source (e.g., $N_2O$, $N_2$ or $NH_3$) in a plasma. Metal halides can be prepared by treating the metal surface with a halide source in a plasma.

When an I-layer is formed by oxidizing a portion of an underlying layer of the device by, e.g., anodization or some types of chemical treatment, the resulting device typically has an entire bottom electrode fully encapsulated in a chemically inert wide band semiconductor material. This is an advantageous feature of this method because such encapsulation prevents shorting between top and bottom electrodes of the device structure, which might otherwise occur around the edges of the bottom electrode layer.

Annealing (Optional)

Upon formation of an I-layer in operation 303, the I-layer can be optionally annealed before operation 305, by, for example, thermal treatment under oxygen or nitrogen ambient. In some embodiments, metal oxides formed by anodization are annealed by exposing the partially fabricated device to a temperature of about 60-300° C. for about 0.25-3 hours.

Deposition of a Semiconductor Layer

After the top portion of the metal electrode has been oxidized, a semiconductor layer is deposited over it in the operation 305. In some embodiments the semiconductor layer is deposited by a liquid-phase method such as spin-coating, slot-coating, spray-coating, screen printing, laser transfer printing, or gravure printing. These methods are preferred when the semiconductor layer comprises organic oligomers, polymers (for example, MEH-PPV, polyalkylthiophene), composite semiconductors with an organic binder, and liquid precursors of inorganic semiconductors.

The semiconductor layer can also be formed by one of vacuum deposition methods including thermal vapor deposition, sputter, CVD, PECVD, atomic layer deposition and the like. Organic semiconductors (single molecules, dimers and trimers with molecular weight of preferably below $5 \times 10^4$) can be deposited by thermal deposition. Some inorganic semiconductor compounds can also be formed by thermal deposition in vacuum or with oxygen. Examples include Mo—O, and V—O. Inorganic semiconductor compounds can be formed by sputtering (e.g., Cu—In—O, $Cu_2O$), by CVD/PECVD or by atomic layer deposition (e.g, Cu—In—Ga—Se, Cu—In—S, Cu—In—Se).

For the thick X-ray absorption layer in direct X-ray photodetectors, amorphous selenium can be deposited by thermal deposition at low substrate temperature. HgI, PbO can be deposited by sputtering or by one of coating methods using a precursor solution. Saturation condensation can also be used when a high crystalline film is desired.

Formation of Top Electrode

After the semiconductor layer has been formed, a second electrode layer is deposited in the operation 307. In certain embodiments, the conducting material of a top electrode is deposited by a liquid-phase processing method. As explained above, liquid-phase processing methods include printing, coating, electroplating, electroless deposition etc. Material of top electrode can be applied from a solution, a suspension, a sol-gel, or a melt. In some embodiments the material is deposited in a patterned manner. In other embodiments, a blanket layer spanning several electronic devices in an array is formed.

Suitable liquid dispensing techniques include immersion, coating, droplet based printing (e.g., ink jet printing), gravure printing, silkscreen printing, thermal transfer printing, offset printing etc. Coating methods include spin-coating, spray-coating, bar-coating, dip-coating, slot coating and the like.

The material can be formed from the liquid phase by solvent evaporation, cooling or heating of the liquid phase, chemically or electrochemically treating a precursor in the liquid phase, treating a material or its precursor in a liquid by irradiation or high temperature to cause material precipitation. Specific examples include, evaporation of solvent from a printed solution of an ink, electroplating a metal, depositing a metal by electroless deposition, depositing material by cooling down a melt, etc.

A variety of solvents may be used to provide a liquid phase, including polar solvent such as water, alcohols, chloroform, etc., and nonpolar solvents such as toluene, xylene, etc.

Liquid-phase deposition may be performed in a patterned manner (e.g., printing a pattern) or conductive material can be blanket deposited.

The top electrode operation 307 can also be formed by one of vacuum deposition methods such as thermal deposition (e.g., for Al, Ag, Au, Mo, etc.), sputter (e.g., for Ni, Cr, Au, In—Sn—O, Sn—O, In—Zn—O) and the like.

After the top electrode has been deposited, the formation of an electronic device is complete. Depending on its characteristics, the device may be used for a variety of purposes, e.g., as a photodetector, a photovoltaic device, or a LED.

As it can be seen, the described fabrication method reduces the number of steps that require photolithographic patterning and vacuum processing as well as other steps associated with high costs in electronic diode production. In some embodiments, methods of this invention provide better control over electrical characteristics of the electronic device and expand the range of materials that can be used for fabrication.

Figure 4:
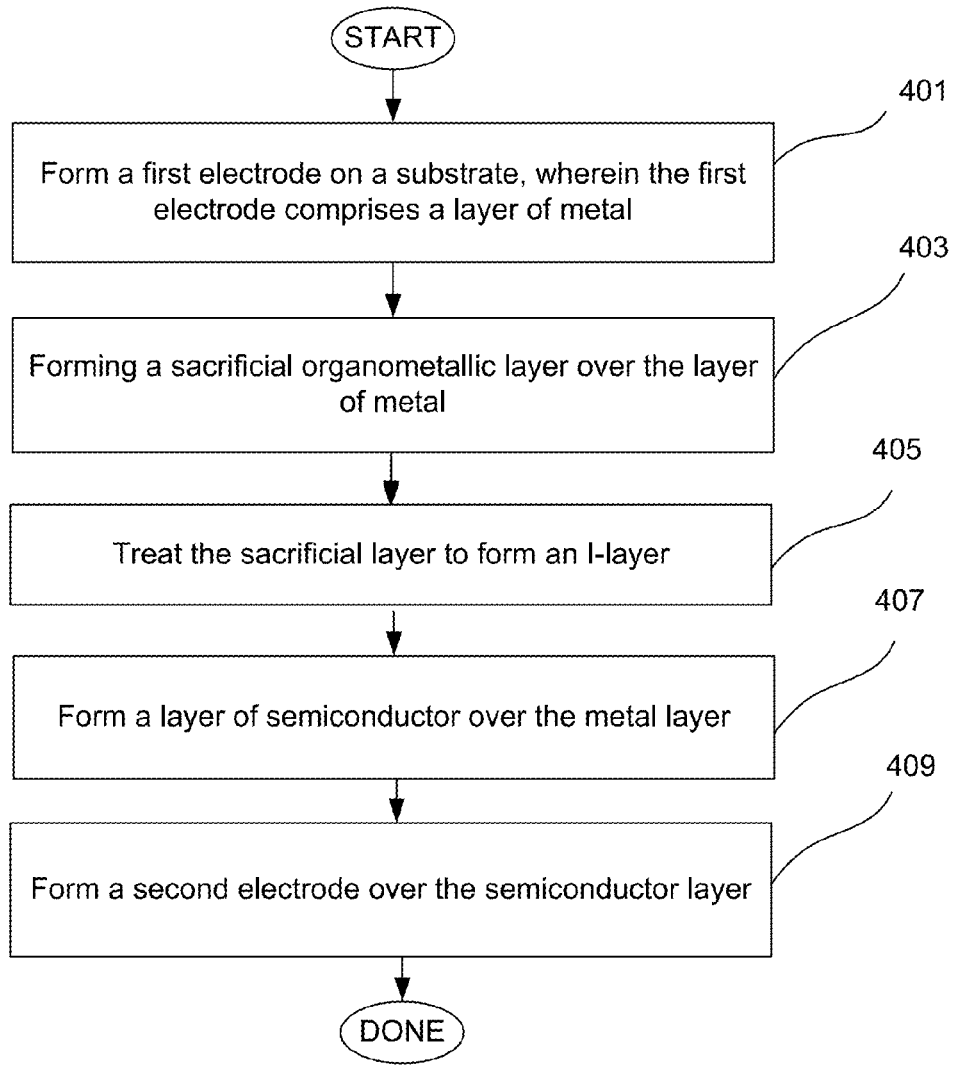
FIG. 4 is a process flow diagram for a process of fabricating an electronic device in accordance with some embodiments of the present invention.

An alternative fabrication method is shown in the process diagram of FIG. 4. In this embodiment, the process starts in 401 by forming a first electrode on a substrate, wherein the first electrode includes a layer of metal. But next, instead of direct oxidation of metal, a sacrificial organometallic layer is deposited onto the first electrode in operation 403, and is then converted to the I-layer material in operation 405. For example, $TiS_2$ I-layer can be formed by depositing a thin sacrificial layer of $Ti(OPr^i)_4$ onto the first electrode layer, followed by converting the sacrificial layer to $TiS_2$ by exposing the partially fabricated device to $H_2S$ or $CS_2$. In other embodiments, the sacrificial layer is converted to a metal oxide or partially to an M-O—C—H containing film by annealing the organometallic layer. Next, in the operation 407 a semiconductor layer is deposited over the I-layer, followed by deposition of the second electrode layer in the operation 409, as it was previously described with reference to FIG. 3. It is noted that, in some embodiments the sacrificial layer can be any suitable metal-containing layer, including a metal salt, or pure metal, that is converted to an I-layer material upon treatment.

Energy Structure of Two-Terminal Devices

Figure 5:
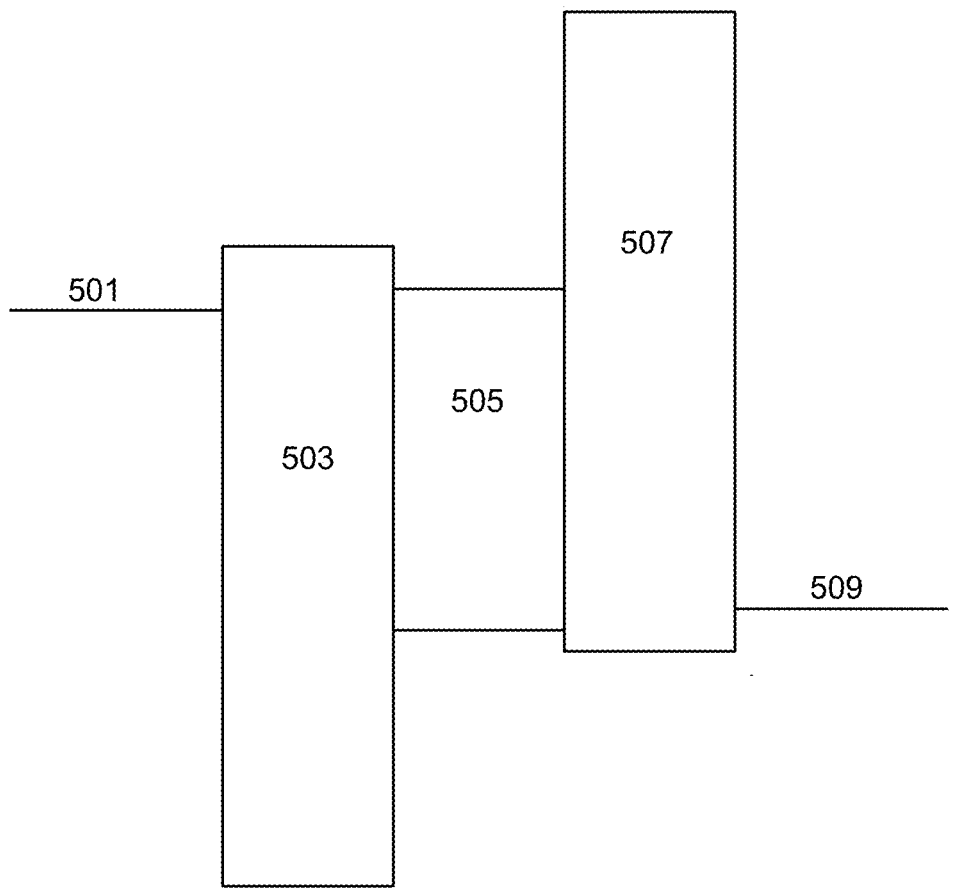
FIG. 5 is an energy diagram for one of the configurations of an electronic device in accordance with an embodiment presented herein.

Energy structure of provided two-terminal devices, according to some of the embodiments, is illustrated by an energy diagram shown in FIG. 5. The diagram refers to energy levels of a device containing a cathode, an I-layer in contact with the cathode, a first semiconductor sub-layer in contact with the I-layer, a second semiconductor sub-layer in contact with the first semiconductor sub-layer, and an anode in contact with the second semiconductor sublayer. The energy level of the cathode 501 (typically a bottom electrode) is higher than the energy level of the anode 509. The I-layer has a wide band gap illustrated as 503. The I-layer is configured for transporting electrons and blocking holes. The band gap of the first semiconductor sublayer 505, that is used for photosensing or light emission is the smallest of the band gaps of the semiconductors in the device. The band gap 507 of the second semiconductor sub-layer (a p-type semiconductor) is larger than the band gap 505 of the first semiconductor sub-layer. The second semiconductor sub-layer is configured for transporting holes and for blocking electrons.

When the device is a light-emitting diode, higher potential is applied to the anode than to the cathode. Holes are injected into the second semiconductor sub-layer, and then to the first semiconductor sub-layer. Electrons are injected into the I-layer, and are then transferred to the first sub-layer. Recombination of holes and electrons occurs in the first sub-layer and results in light emission. The blocking capacity of the I-layer and of the second semiconductor sub-layer confines the charges (holes and electrons) to the first sub-layer and leads to improved light emission efficiency.

When the device is operated as a photovoltaic cell, no external potential is applied to the electrodes. When the device is operated as a photodetector or photodiode, either no external potential is applied to the electrodes or the potential is negative, that is higher potential is applied to the cathode than to the anode. In this instance, absorbed light generates electrons and holes in the first semiconductor sub-layer 505. Holes that are generated in the first sublayer 505 are transported to the second sublayer 507 and are collected at the anode 509. Electrons that are generated in the first semiconductor sublayer 505 are transported to the I-layer 503 and are then collected at the cathode 501. The blocking capacity of the I-layer and of the second semiconductor layer prevent the charges (electrons and holes) from moving in an incorrect direction, especially at low bias. The wider gap of the I-layer 503 and of the second semiconductor sub-layer 507 further also reduces dark current. It is noted that photovoltaic cells may function with a single semiconductor layer, while it is preferable to use a bi-layer semiconductor layer for the photodetectors since this configuration is particularly efficient for reducing dark current (current observed in the absence of photosignal) and improving detection of small photosignals.

Alternative Embodiments

While in the embodiments described above, the first electrode layer includes a layer of metal, and the I-layer includes a layer of a metal compound made of the same metal, in alternative embodiments other configurations may be used. For example, in some embodiments, the first electrode is any conductive material (e.g., an ITO, InZnO, AlZnO or other conductive oxide), and the I-layer is a metal compound or an organic/inorganic blend prepared from a sacrificial layer. In yet another embodiment, the first electrode is a first metal, and the I-layer is a compound of a second, different metal, prepared e.g., by complete oxidation (e.g., formation of second metal oxide, nitride, chalcogenide, or halide) of a sacrificial metal layer, deposited on a first metal layer.

EXAMPLES

Example 1. UV Detector

In accordance with one example, a UV detector is provided which has the following structure: M/MO/p-type semiconductor/TCO. In some embodiments the metal, M, is Ti, Ta, Zn, In, Sn, or Ga. The I-layer is a metal oxide layer, where the oxide is formed in a self-aligned manner from the top portion of the first electrode by oxidation which can be achieved by annealing the metal in $O_2$ environment, by treating the metal with $O_2$ plasma, by anodization of the metal, or by heating the metal and contacting it with $H_2O_2$, or by a combination of the processes listed above In those cases where metal oxide is formed by a dry process (e.g., $O_2$ plasma, heating in $O_2$-contained environment) or by a wet process (e.g., by anodization, or hydrogen peroxide treatment), the surface of the oxide may be cleaned, e.g., with a water rinse and is then dried. A p-type organic or inorganic layer or both in stack or in a blend form is then deposited on the clean dry surface of metal oxide. Examples of organic semiconductors that can be used include TPD, NPB (e.g., deposited by thermal deposition), PFO or polymers comprising TPD or NPB group (e.g., deposited by spin-coating or slot coating). Examples of inorganic p-type semiconductors that can be used include MoO, NiO, NiN and SiC which can be deposited by thermal deposition, sputter or MOCVD/PECVD. Next, a top-conducting-oxide (TCO) layer, a conductive polymer layer or a semitransparent metal layer is deposited. The onset of the photoresponse is determined by the absorption edge of the metal oxide and the semiconductor layer (also referred to as a hole transport layer, HTL). For example, when $TiO_2$ is used in the I-layer and NPB is used in the semiconductor layer the response starts at approximately 400 nm. When SnO is used for the I-layer and NPB is used in the semiconductor layer, the onset of response starts at ~320 nm and therefore a solar-blind UV detection can be achieved. The onset of photoresponse ties with the onset of interband transition or absorption edge. At this wavelength, the electron on top of the valence band is excited into the bottom of conduction band in either I-layer, or the broadband p-type semiconductor layer or both which can be extracted at the contact electrodes above and below.

In one experimentally validated example (Sample UV-A), a glass substrate (Corning Eagle 2000) of 1"×1" was used. 100 nm Ta metal layer was deposited by DC sputtering using 100 W power level at a pressure of 10 mtorr in argon environment. It was patterned by photolithography and by dry etching to form an array of patterned bottom electrodes 10 mm×1.8 mm in size and separated by 0.2 mm. A protection photoresist (PR) coating was then formed on the contact areas of Ta electrodes and the structure was baked at 130° C. for 10 minutes. The surface of Ta was then oxidized by anodization to form $Ta_2O_5$, I-layer (similarly to the process used to form two terminal M-I-M switch devices described in Example 1 of U.S. Pat. No. 8,222,077 which is herein incorporated by reference in its entirety. The protection PR coating was then removed with a stripper solution, and the sample was then rinsed in deionized water and was blow-dried. The sample was then sent into a vacuum chamber, where a 200 nm thick Mo—O layer was thermally deposited as the p-type semiconductor layer, and then a transparent, conductive In—Sn—O top electrode (~100 nm thick) was sputter deposited by a direct current (DC) source at room temperature and under argon pressure of ~10 mtorr. It is noted that in this case the tantalum oxide layer is self-aligned with the bottom electrodes, and is therefore not shared by neighboring devices, while the MoO layer, and the top electrode are continuous and are shared by a plurality of devices. In this sample photocurrent was observed under light illumination from top (through the ITO layer) for wavelengths shorter than 400 nm with external quantum efficiency in a range of 20-50% el/ph.

In another experiment (Sample UV-B), the bottom tantalum electrode was deposited, and the tantalum oxide I-layer was formed as described for the Sample UV-A but the semiconductor layer was 100 nm thick PFO layer that was spin coated at 2000 rpm, as a continuous layer spanning a plurality of devices. The PFO coating was then baked at 150° C. for 30 minute to remove solvent. The sample was then coated with a PEDOT:PSS solution with a bar-coater such that it does not contact the bottom electrode contacts. Another baking at 150° C. for 30 minutes was carried out to remove the solvent in PEDOT:PSS, where PEDOT:PSS served as the top electrode. Photosensitivity in the UV region was observed to be similar to the UV-A sample described above. Dark current below 1 nA/cm$^2$ was achieved which was hardly achievable with traditional UV detectors that are based on SiC or GaN crystalline wafers. The low dark current and high photosensitivity results in low detector noise and high device detectivity of above $10^{12}$ Jones.

In another experiment (Sample UV-C), the substrate was a quartz plate and the bottom electrode was In—Sn—O formed by DC sputter at 100 mW power level at room temperature. After patterning the bottom electrode with standard wet photolithography and with acetic acid, a Zn—O—C—H containing film was formed in N$_2$ environment from a precursor solution containing zinc acetate dihydrate monoethanolamine (0.5 M) and 2-methoxyethanol. The solution was coated as a continuous layer shared by a plurality of devices and was then baked at 150° C. for 30 minutes in air or under N$_2$ environment to form a continuous layer of Zn—O—C—H. Next, a MoO semiconductor layer (a continuous layer spanning a plurality of devices) and a top ITO electrode was deposited identically to deposition of these layers in Sample UV-A. A transparent UV detector was achieved with response in 200-400 nm range. UV detection was achieved from both top and bottom illumination. The detector is transparent over the entire visible range. Such transparent UV detector can be used as a UV index meter and can be integrated into a variety of portable electronics, such as a smart watch or a mobile phone.

Example 2. Broadband NIR/Visible Light Photodetectors and Photovoltaic Cells

When narrow energy gap semiconductor is used in the semiconductor layer, absorption is shifted to longer wavelengths. IR and/or visible light photodetectors can be built. These devices can also be used as photovoltaic devices.

The bottom electrode layer is a metal layer. In some embodiments the metal is Ti, Ta, Zn, In, Sn, or Ga. The I-layer is a metal oxide layer, where the metal is the same metal as used for the first electrode. The semiconductor layer can be organic or inorganic p-type semiconductor, or an organic/inorganic blend, or a stack. Examples of suitable materials include PPV, MEHPPV, P3HT, PCPDTBT, PDDTT, CuO, PbS, CuInSe, CuInS, CuInGaSe. Such devices can be used as single detectors but are especially suitable for detector arrays due to simplicity of their manufacturing process and high process yield. In the array devices, the sensor pixel can be defined by the bottom metal pattern, the remaining layers can be deposited in blanket form over entire detector array, while the I-layer is formed over the patterned bottom electrode layer in self-aligned manner without lithographic process. The I-layer passivates the bottom pixel electrodes from all directions (i.e., covers the top portion and side portions of a bottom electrode)

In one experimentally validated example, 0.5 mm thick borosilicate glass (Corning Eagle 2000) was used as the transparent substrate. 200 nm thick Ta was DC sputter deposited at room temperature. The Ta layer was then patterned into same patterns as in the UV-A example. The tantalum oxide I-layer was then formed by anodization in the same way as described in the UV-A example. Thickness of the I-layer was chosen in this experiment to be 20 nm. The semiconductor layer was then deposited either by spin-coating or thermal deposition for organic semiconductors or by RF sputter for the inorganic compounds either directly or by depositing corresponding metal oxides and converting them to sulfides and selenides. Samples containing PPV, MEHPPV, P3HT, PCPDTBT, PDDTT, CuO, PbS, CuInSe, CuInS, and CuInGaSe were prepared. The top electrode was then deposited. In one series of devices the top electrode was AZO (aluminum-zinc-oxide) formed by thermal deposition in vacuum. In another series of devices the top electrode was ITO formed by sputter deposition under argon Ar. Post annealing was performed for devices with spin-coated organic semiconductors at 150° C. for 30 minutes and for devices with sputtered films at 250° C. for 60 minutes. The short wavelength cut-off of the photoresponse for obtained devices is ~400 nm for devices with the AZO top electrode and ~300 nm for devices with the ITO top electrodes.

In another experiment photovoltaic cells in which the bottom electrode is a cathode and the top electrode is an anode (used without external bias) and photodiodes were formed. Device test with light illumination from top revealed diode behavior with photoresponse above semiconductor energy gap. The onset of the photoresponse coincides with the absorption of the semiconductor layer as listed in Table 1. With soluble fullerene molecule PCBM (as a photosensitizer) blended into the semiconductor polymer, internal quantum efficiency near 100% el/ph was achieved. Table 1 lists materials, structures, process methods and spectral responses of the formed devices

TABLE 1

| Photodetectors having response in the NIR and/or visible region | | | | |
|---|---|---|---|---|
| Bottom Electrode | I-layer | Semiconductor Layer (thickness, process means) | Top Electrode (process means) | Onset of Photoresponse |
| Ta | Ta—O (20 nm) | PPV (200 nm, spin-coating) | AZO (Thermal) | 500 nm |
| Ta | Ta—O (20 nm) | MEHPPV (200 nm, spin-coating) | AZO (Thermal) | 590 nm |
| Ta | Ta—O (20 nm) | P3HT (200 nm, spin-coating) | AZO (Thermal) | 640 nm |
| Ta | Ta—O (20 nm) | PTB7 (200 nm, spin-coating) | AZO (Thermal) | 750 nm |
| Ta | Ta—O (20 nm) | PCPDTBT (200 nm, spin-coating) | AZO (Thermal) | 1000 nm |
| Ta | Ta—O (20 nm) | PTZBTTT-BDT (200 nm, spin-coating) | AZO (Thermal) | 1100 nm |
| Ta | Ta—O (20 nm) | PDDTT (200 nm, spin-coating) | AZO (Thermal) | 1400 nm |
| Ta | Ta—O (20 nm) | CuO (200 nm, sputter) | ITO (sputtered) | 550 nm |
| Ta | Ta—O (20 nm) | PbS (Sputter) | ITO (sputtered) | 700 nm |
| Ta | Ta—O (20 nm) | CuInSe (Sputter + selenation) | ITO (sputtered) | 1200 nm |
| Ta | Ta—O (20 nm) | CuInS (Sputter + sulfination) | ITO (sputtered) | 900 nm |
| Ta | Ta—O (20 nm) | CuInGaSe (Sputter + selenation) | ITO (sputtered) | 1200 nm |

In other experiments, the thickness of Ta—O layer was varied in the 10-50 nm range. Similar photoresponses as with 20 nm Ta—O were observed. Lower dark current was observed in a device with thicker Ta—O. This fact confirms that one can tune the thickness of the I-layer to optimize overall device performance.

In another series of experiments instead of Ta—O, Ti—O was used as the I-layer in similar structures. Higher forward current was observed in Ti—O— containing device with the same I-layer thickness.

Example 3. Visible/Near-Infrared (NIR) Detector Array with an Unpatterned Semiconductor Layer In this example, the bottom electrode was made with a 100 nm thick ITO or a 100 nm thick Ag layer by DC sputtering, which was then patterned by lithography to define individual devices. Titanium oxide I-layer was formed by DC sputtering of titanium metal layer with nominal thickness of 10 or 50 Anstrong, and then the unpatterned Ti was oxidized to $TiO_2$ by thermal oxidation at 200° C. A blend polymer semiconductor comprising either PTB7:$PC_{70}$BM or PCPDTBT:$PC_{70}$BM (1:2 weight ratio, purchased from 1-Materials, Dorval, Quebec, Canada) was coated from a blend solution at room temperature over the I-layer and was then dried at 150° C. for 30 minutes to remove residual solvent. Toluene and chlorobenzene were used for as solvent for this study. The thickness of this layer (referred to as a sensing layer or the first semiconductor sub-layer) was approximately 200 nm. It is an organic semiconductor with bulk p-n junctions in nanoscale, in which photoinduced holes transport in PCPDTBT and photoinducted electrons transport in PCBM (Gang Yu et al., SCIENCE•Vol. 270, p. 1789 (1995)). The samples were then sent into a vacuum chamber and the pressure was reduced to $5\times10^{-7}$ torr. A MoO layer (a second semiconductor sub-layer) was then thermally deposited on top of the semiconductor polymer layer (the first semiconductor sub-layer) with thicknesses of 20, 40 and 80 nm for different samples. The formed MoO layer is a p-type semiconductor and is amorphous. It transports holes to and blocks electrons from reaching the anode on top of the device. No substrate heating was performed during MoO deposition.

For a bottom sensing array, a 100 nm Ag layer was then thermally deposited on top of the MoO as the top anode with optical reflection. A cover glass sheet was glued over the array area as the final passivation step. Top sensing image array was also made with a transparent top electrode. In this array, a thin Ag layer (10-15 nm) or a Ag/MoO blend coating layer (1:1 ratio, 10-20 nm) were used as the transparent anode. A 200 nm SiOx was then thermally-deposited on top of whole active area as a thin film passivation layer.

Figure 6A:
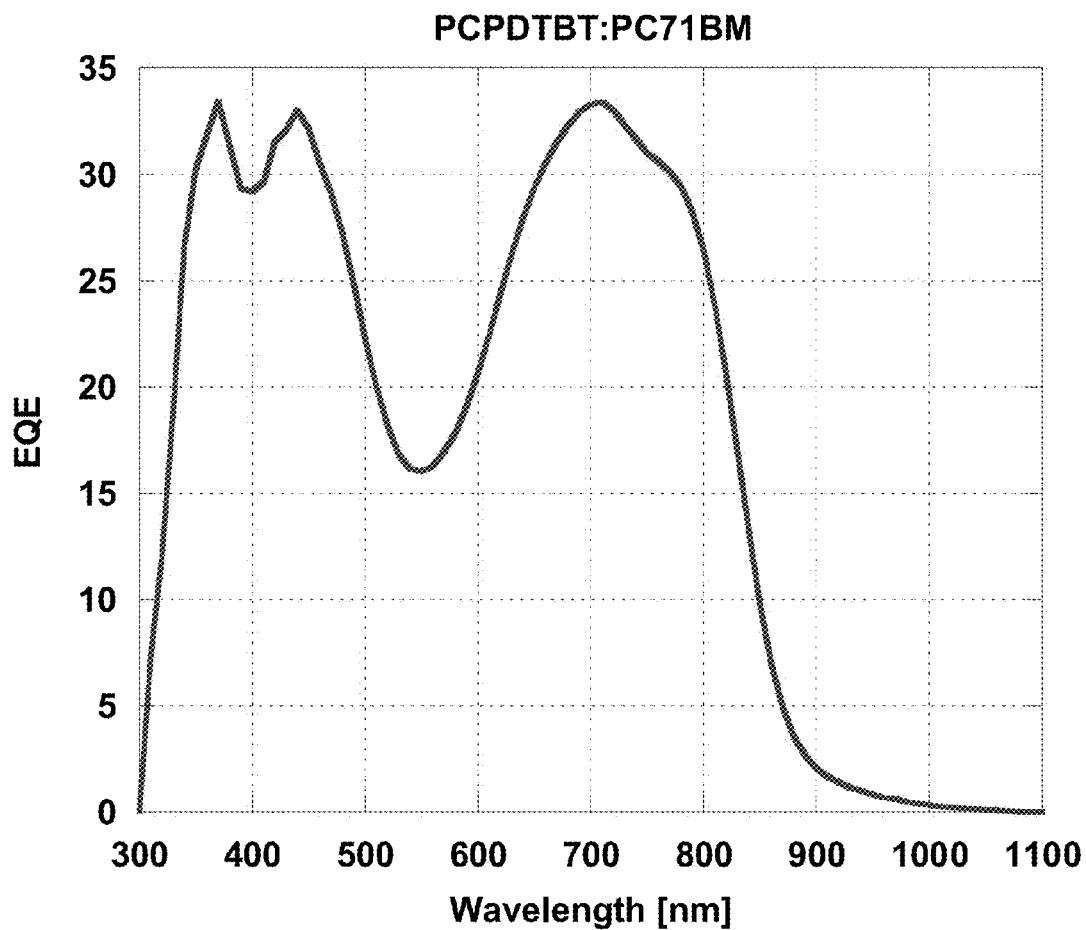
FIG. 6A is an experimental plot illustrating external quantum efficiency (EQE) dependence on a wavelength for a top-sensing image array, according to an embodiment presented herein.
Figure 6B:
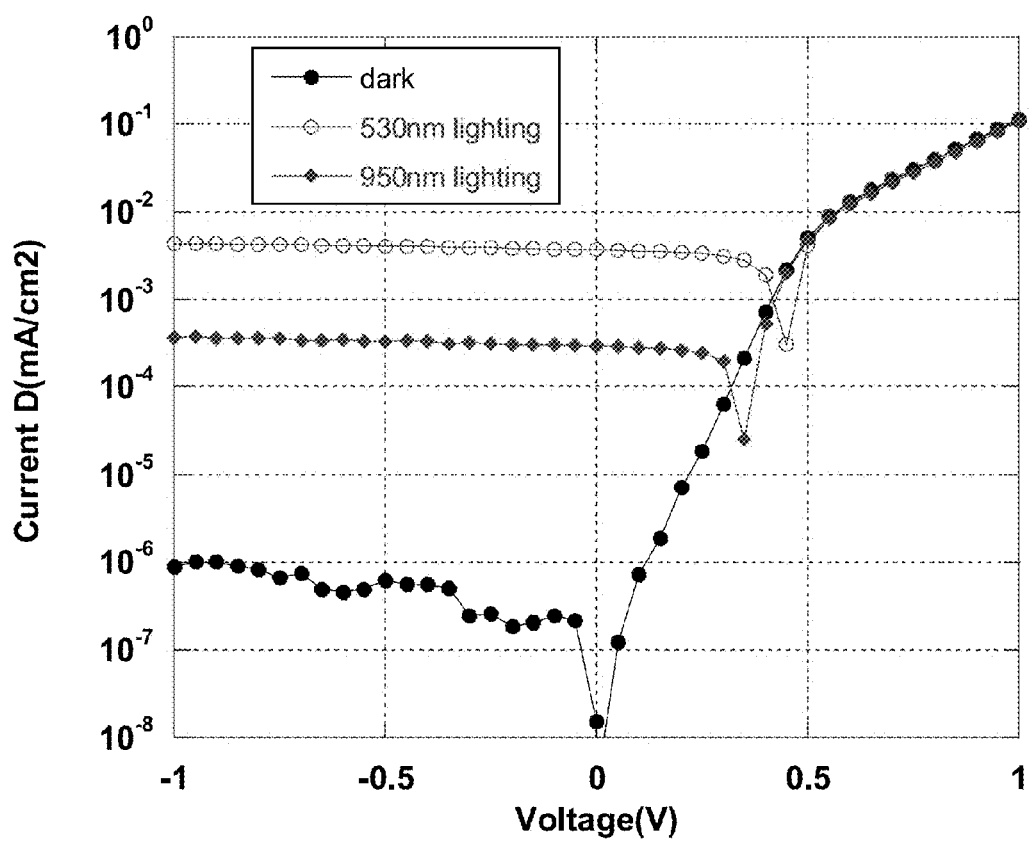
FIG. 6B is an experimental plot illustrating I-V characteristics upon illumination with light of different wavelengths and in the dark, for a top-sensing image array, according to an embodiment presented herein

FIGS. 6A-6B show performance data for the top sensing image array made with PCPDTBT:$PC_{70}$BM first semiconductor sub-layer as described above. FIG. 6A shows the spectral response, covering from 300 nm to over 1000 nm. The external quantum efficiency (EQE) is over 30% el/ph in most regions. FIG. 6B shows the current-voltage dependence in the dark and under light illumination. The Iph-V curves were taken under 22 µW/$cm^2$ at 530 nm and 16 µW/$cm^2$ at 950 nm. The dark current, is below 0.2 nA/$cm^2$ for bias within +/−0.3V and is below 1 nA in −1V to 0V range. The photocurrents are 3-4 orders of magnitude higher than the dark current. The corresponding peak photosensitivity was 0.18 A/W and the peak EQE was >30% el/ph. Assuming the noise is limited by the dark current, the corresponding detectivity D* is ~$10^{13}$ Jones. For a sensing element with the bottom cathode made with strong reflection, and a thin film passivation with optimized transmission, the EQE can be further improved to 60-80% el/ph.

Figure 6C:
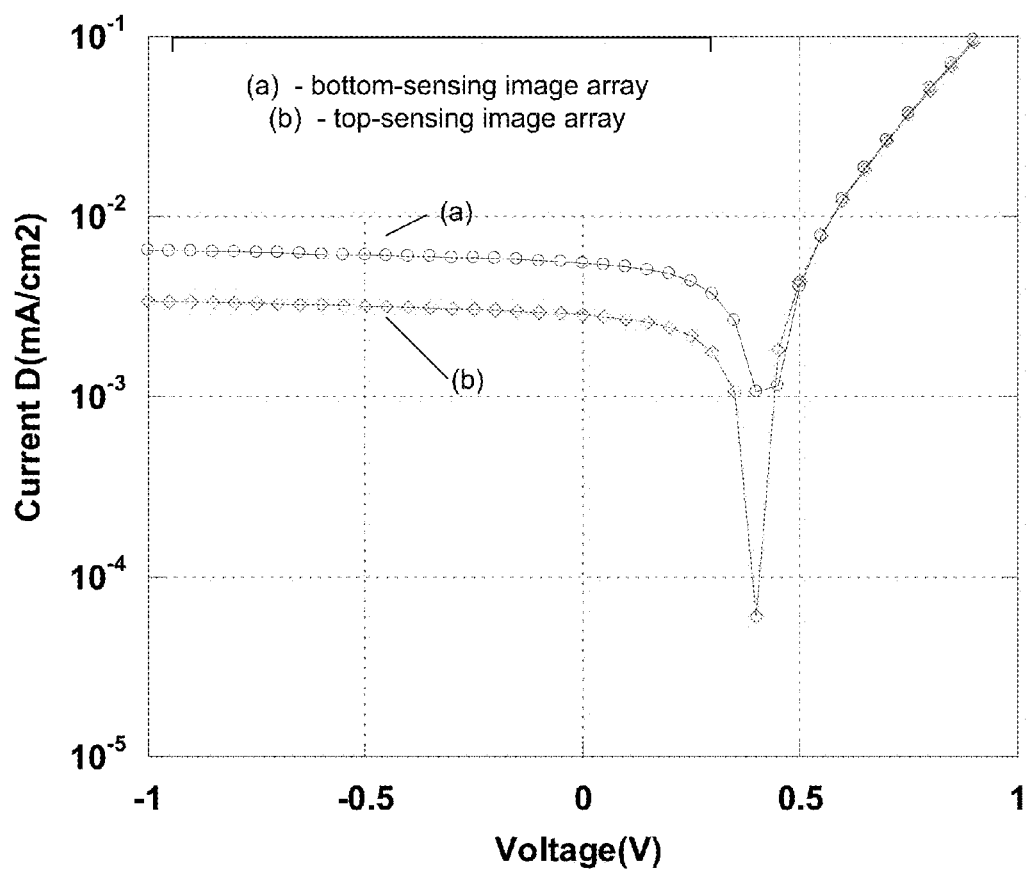
FIG. 6C is an experimental plot illustrating I-V characteristics for a top-sensing image array and for a bottom-sensing image array.

Such an image array, in fact, can sense light from both bottom and top, as shown in FIG. 6C. Curve (a) illustrates data for a top-sensing image array. Curve (b) illustrates data for a bottom-sensing image array.

In another set of experiments instead of self-aligned Ti—O I-layer, solution processed Ti—O or Zn—O were used to form an unpatterned I-layer. The Zn-containing precursor was prepared by dissolving zinc acetate dihydrate ($Zn(CH_3COO)_2 2H_2O$, Aldrich, 99.9%, 1 g) and ethanolamine ($NH_2CH_2CH_2OH$, Aldrich, 99.5%, 0.28 g) in 2-methoxyethanol ($CH_3OCH_2CH_2OH$, Aldrich, 99.8%, 10 mL) under vigorous stirring for 12 h. The Ti-contained precursor was prepared using a similar procedure, but the zinc salt was substituted for a titanium salt. In device fabrication, the Ti-containing or Zn-containing precursor solution was spin-cast onto pre-cleaned ITO for a transparent image array or onto patterned Ag layer for a top-sensing image array. The sample was then annealed at 200° C. for 1 hour in air to convert the precursor into an unpatterned TiO or ZnO I-layer. The semiconductor layer and the top electrode were deposited as described above for Experiment 3.

A 1×32 linear photodetector array used for this experiment. Each sensor was connected to a test pad and was connected to a readout circuit (Texas Instrument, DDC264). We note that other than the bottom electrode patterned to provide a size defining the photodiode array, and the I-layer formed by surface oxidation in a self-aligned manner with the bottom electrode, all of the layers above I-layer (the active polymer sensing layer, the p-type MoO layer and the top electrode) were covering the entire array area without pixel patterning. Accordingly, a novel image array with pixel pitch defined by bottom pixel contact pads is disclosed. In the embodiments, where metal oxide was deposited from a precursor solution and was unpatterned, the only patterned layer in the device is the bottom electrode.

Example 4. Infrared Photodetector Array with Onset Response in Short-Wave Infrared (SWIR) Range Experiment presented in example 3 was repeated with the semiconductor polymer layer (first semiconductor sub-layer) replaced by PDDTT (Y.-J. Xia et al, Appl. Phys. Lett. 89, 081106 (2006)). All other layers were deposited as described in Experiment 3. Photoresponse of the formed photodetector array was extended into SWIR range with photoresponse onset at >1.4 µm. In samples made with PDDTT having high molecular weight, the photosignal was detectable for wavelengths longer than 1.6 µm.

In another experiment, the photodetector array was formed as described in the Example 3 but the un-patterned blend semiconductor layer (first semiconductor sub-layer) was made with PCPDTBT as a binder with added nano particle PbSe (PbSe:NP) as a photosensitizer. Linear array was prepared following a procedure that is similar to the one described in Example 3. Onset of photoresponse at 2200 nm was observed. Table 2 lists arrays of photodetectors (their structure and properties) prepared as described in Example 3 and Example 4.

TABLE 2

Photodetector arrays prepared by the methods described in Examples 3 and 4.

| Bottom electrode | I-layer | Semiconductor Layer-1 | Semiconductor Layer-2 | Top electrode | Onset of Photosensitivity |
|---|---|---|---|---|---|
| ITO/Ti(5 nm) (sputter deposited and patterned) | TiO (anodized Ti, self-aligned) | PTB7:PCBM (spin-coating) | MoO (thermal deposition) | Ag:MoO (1:1, thermal deposition) | 750 nm |
| Same as above | TiO (Thermal oxidation, 250° C.) | Same as above | Same as above | Same as above | 750 nm |
| Ag (100 nm) | TiO (precursor coating + annealing) | Same as above | Same as above | Same as above | 750 nm |
| ITO | Same as above | PCPDTBT:PCBM (spin-coating) | Same as above | Same as above | 950 nm |
| ITO | ZnO (precursor coating + annealing) | same as above | Same as above | same as above | 950 nm |
| ITO | TiO (precursor coating + annealing) | Same as above | Same as above | same as above | 950 nm |
| Same as above | Same as above | Same | Same as above | IZO (sputter) | 950 nm |
| Same as above | Same as above | PCPDTBT:PbSe-NP (spin-coating) | Same as above | Ag:MoO (Thermal deposition) | 2200 nm |
| Same as above | Same as above | Same | NPB (Thermal deposition) | Ag:MoO (Thermal deposition) | 950 nm |
| Same as above | Same as above | PDDTT:PCBM | Same as above | AZO (sputter or thermal) | 1400 nm |
| Same as above | Same as above | CuInSe (sputter deposition + selenation) | MoO (Thermal deposition) | Ag:MoO (Thermal deposition) | 1200 nm |

Example 5. Two Dimensional Image Arrays

Two dimensional sensor array can be manufactured by integrating the photodiode arrays on top of a read out integrated circuit (ROIC) made on Si wafer. It can also be built with readout circuit made with thin film transistor (TFT) on a glass or a plastic substrate. The channel material of the TFT array can be low temperature polysilicon, metal-oxide semiconductor film, II-VI compound semiconductor film such as CdSe, a-Si film or an organic semiconductor film.

As an example, a 220×220 image array of photosensors was prepared. The photodetectors had the structure shown in Table 2 for the sample, in which PDDTT:PCBM polymer blend was used as the semiconductor sensing layer (first semiconductor sub-layer). An image readout circuit was constructed with metal-oxide TFT (MOTFT) on glass substrate. The photoresponse of the array was in a range of 300 to 1400 nm. The array was built with a pixel pitch of 50 μm and had an active area of 11 mm×11 mm. Only the bottom electrodes were patterned to each pixel pitch and defined the size of the sensing element. The aperture ratio (the area of the sensing element to total pixel pitch area) was ~80%. The semiconductor sensing layer (first semiconductor sub-layer), the MoO hole transport layer (second semiconductor sub-layer) and the top electrode layer were all formed continuously over entire array area. The image readout follows conventional line-scan operation row by row. A commercial gate driver chip was used as the scan driver and two pieces of commercial ROIC (readout integration circuit) chips (Flir 9717) were used as data readout chip. The digital image signals were sent to an image processor and showed over a computer monitor. High quality images with 50 μm special resolution, and with dynamic range over 214 was observed.

Image arrays were also made with the same 220×220 image readout array and with the sensing layer (first semiconductor sub-layer) replaced with PCPDTBT:PCBM, and with CuInSe.

Example 6. X-Ray Detector

Large size X-ray photodetector array was prepared by placing a commercially available X-ray scintillator sheet on top of the top-sensing two dimensional visible image array. In this experiment, a 4" diagonal MOTFT pixel readout array was designed in 320×240 format with pixel pitch of 255 μm. CdS:I was used as the X-ray phosphor. Its emission profile extends in 400-620 nm range, matching well with the spectral response of PTB7:PCBM and P3HT:PCBM. In this example, the top metal layer used for MOTFT source/drain electrode (Mo/Al/Mo stack) was used directly for the bottom electrode material. The I-layer was formed by spin-coating a Zn-containing precursor solution over the patterned pixel electrodes (cathodes). The dried zinc precursor film was converted into ZnO layer after annealing at 200° C. for 1 hour. The polymer blend layer (first semiconductor sub-layer) was then coated over the ZnO I-layer and was heated to 150° C. for 1 hour to remove solvent. Inorganic hole transport layer (HTL) MoO was used as p-type semiconductor layer (second semiconductor sub-layer) and finally, transparent AlZnO or ITO was sputter deposited over the array as the top common anode electrode. 200 nm thick MoO was then deposited as a thin-film passivation layer over the top anode. The CdS:I X-ray phosphor sheet was then placed over the sensing array. When X-ray beam contacts the free surface (top) of the CdS:I, visible light emission occurs with emission intensity proportional to the incident X-ray photon density. The visible image is detected by the visible image arrays located underneath the X-ray phosphor. Photocurrent corresponding to emission intensity from CdS:I sheet is read out row by row and the analog current signal is converted into digital signal and transferred into image frame buffer in the image processor and displayed over the computer monitor.

Direct X-ray photosensor can also be made. In this case, the photosensor layer (first semiconductor sub-layer) is replaced with either 300 μm thick amorphous selenium formed by thermal deposition, or a 300 μm thick PS:HgI (1:9 weight ratio) blend layer. By applying reverse bias of 60-300V, sufficient photocurrent is created due to electron excitation from core energy levels of these materials. In this case, the X-ray scintillation layer is not needed. A listing of X-ray detector arrays, prepared in accordance with Example 6 are listed in Table 3.

organic NPB layer with thickness in range of 20-80 nm. Similar performance was observed.

In another device, by replacing the transparent bottom ITO layer with patterned zinc metal layer, zinc oxide I-layer was formed by means of oxygen plasma reaction or direct heating in $O_2$ atmosphere at 200° C. over the zinc bottom electrode. A transparent top electrode (Ag:MoO with 1:1 ratio, 20 nm) was used in this example and thereby a top-emission OLED was achieved. Other deposited layers (first and second semiconductor sub-layers) were the same as in the bottom emission OLED described above.

In experiment 2, alumina precursor was deposited on patterned ITO surface by spin-coating and was converted to $Al_2O_3$ after heating at 200° C. in air. Examples of Al-containing precursors that are suitable for such deposition are described in J. Mater. Chem. C, 2014, 2, 864, which is herein incorporated by reference in its entirety This alumina layer functions as the I-layer. Semiconductor layer 1 which functions as light emission layer included organic molecule Alq (20 nm) or molecular blend CBP:Irppy3 (~20 nm). These were deposited by thermal deposition in vacuum with base pressure below $3 \times 10^{-7}$ torr. The following layers were the same as that used in experiment 1. Both fluorescent and phosphorescent OLED devices were fabricated. When biased at forward (high potential applied to anode) direction with voltage above 2.5 V, green light emission was observed

TABLE 3

X-ray detector arrays.

| Bottom electrode | I-layer | Semiconductor Layer-I | Semiconductor Layer-II | Top electrode | Thin film barrier | X-ray Phosphor |
|---|---|---|---|---|---|---|
| Mo/Al/Mo | ZnO (precursor coating + 200° C. annealing) | P3HT:PCBM blend polymer | MoO | AlZnO or ITO | MoO | CdS:I |
| Same | same | PTB7:PCBM | Same | Same | Same | Same |
| Same | Same | Amorphous Selenium (300 um, thermal deposition, no substrate heating) | Same | Same | Same | None |

Example 7. Light Emission Device with Bottom Cathode

This example includes a series of experiments listed below.

In experiment 1, ITO was used as the transparent bottom electrode. A thin ZnO layer was used as the I-layer and was formed over ITO by coating a zinc oxide nanoparticle film that was baked at 90° C. for 1 hour. In this case, the I-layer serves as an electron injection and transport layer in the light emitting device. Then, an organic layer which functioned as carrier transporting and light emission layer was thermally deposited in a vacuum chamber. The thin emission layer (first semiconductor sub-layer) contained a blend of mCP:FIrpic (93:7 weight ratio) with thickness of 10-30 nm. A p-type inorganic semiconductor MoO layer (20-80 nm) was then thermally deposited over the emission layer and served as a hole transport and electron blocking layer (second semiconductor sub-layer). A 100 nm thick Ag or Al metal layer was thermally deposited over the MoO layer as the top electrode (anode). A high efficiency, bottom emission, blue phosphorescent OLED was achieved. In another experiment, the inorganic p-type MoO layer was replaced with an in both devices. At a given forward current, higher emission intensity was observed in device with CBP:Irppy3. In another experiment, the I-layer was replaced with a thin Ta—Al or Zr—Al alloy (~5 nm) which was deposited by co-sputter with the corresponding metal targets, and was then thermally oxidized to $Ta_2O5-x-Al_2O_{3-y}$ or $ZrO_{2-x}$—$Al_2O_{3-y}$ layer by annealing at temperature above 200° C. Green emission was observed when biasing such devices in forward bias over 3V.

In another experiment, the Alq emission molecule was replaced with Balq. The other layers were not changed. Blue light emission was observed under forward bias larger than 3V.

In experiment 3, ITO was used as the bottom electrode. Zirconia was used as the I-layer and was formed by spin-coating a zirconium-containing precursor solution followed by heating under oxygen ambient at 250° C. The ZrO I-layer serves as electron injection/transport layer as well as hole blocking layer. PFO-based blue, green or red emission polymers were then spin-coated from their chlorobenzene solutions. The PFO-based layer served as the first semiconductor sublayer. MoO or NPB were used as the p-type second semiconductor sublayer. 100 nm Ag was used as the top electrode. Bottom emission organic light emitting devices were formed with emission color in red, green and blue colors in visible spectral range A top emission device was also fabricated with a ZrAl metal alloy layer used as the bottom electrode. The surface was oxidized by oxygen plasma followed by baking at 200° C. In this case, transparent top electrode was made with 20 nm Ag:MoO blend layer with (1:1) weight ratio. A 80 nm MoO layer were deposited on top of second electrode as thin film passivation. Other layers were the same as described above.

In experiment 4, ZnO was used as the I-layer and was formed from Zn-containing precursor solution. Red, green and blue LEDs were achieved with CdSe quantum dots (QD) layer as the first semiconductor sublayer. It was formed by slot-coating or dip-coating of the QD solution, followed by a soft baking at 120° C. to remove solvents. MoO or NPB was used as the second semiconductor sublayer and served as hole transport and electron blocker. It was observed that the ZnO I-layer provided sufficient electron injection, and light emission occurs at forward voltage right above the corresponding optical photon energies.

In experiment 5, the bottom electrode and the I-layer were replaced with Ti/TiO or Ta/TaO formed with surface oxidation and used as the first electrode/I-layer. The two semiconductor layers were kept without change. 20 nm Ag:MoO (1:1 weight ratio) was used as a transparent top electrode. Top emission LEDs were achieved with similar operation voltage and emission efficiency.

It is important to note that in the Experiments 4 and 5 bottom emission and top emission LEDs were obtained with amorphous inorganic films and nanocrystalline quantum dot emitters in the semiconductor layer, No organic materials were present in the completely processed devices of experiments 4 and 5. It is also noted that if a transparent bottom electrode of experiment 4 and a transparent top electrode of experiment 5 are used in a single device, this device will be a fully transparent LED in the visible spectral range. Table 4 lists a variety of LEDs prepared as described in the Example 7.

Thermally deposited MoO was used as a passivation layer in all experiments presented in Table 4, with the exception of Experiment 2 (blue color, bottom emission), where epoxy on glass was used as a passivation layer over the top electrode.

The full names of chemicals corresponding to Example 7 are list below.

mCP is 1,3-Di(9H-carbazol-9-yl)benzene, 9,9'-(1,3-Phenylene)bis-9H-carbazole, N,N'-Dicarbazolyl-3,5-benzene FIrpic is Bis[2-(4,6-difluorophenyl)pyridinato-C2,N](picolinato)iridium(III)

Alq is Tris-(8-hydroxyquinoline)aluminum

BAlq is Bis(2-methyl-8-quinolinolato-N1,O8)-(1,1'-Biphenyl-4-olato)aluminum

CBP is 4,4'-Bis(N-carbazolyl)-1,1'-biphenyl

Irppy3 is Tris[2-phenylpyridinato-C2,N]iridium(III)

It is noted that, when used in this application, the oxides, sulfides and other chalcogenides mentioned in this application need not necessarily be interpreted as stoichiometric. Thus, for example MoO, MoOx and $MoO_3$ may refer to the same compound.

High pixel density emissive displays can be made with the bottom cathode light emitters shown in this example. It is noted that such bottom cathode light emitting devices are particularly suitable for active matrix displays with n-type metal-oxide TFT. Similarly to that in image array devices, only the bottom electrode needs to be patterned to pixel level, while the other layers can be formed with coating over the entire display area.

What is claimed is:

1. A two-terminal X-ray or high energy radiation detector comprising:
   (a) a first electrode comprising a conductive material;
   (b) an I-layer comprising an inorganic insulating or a broad band semiconducting material over the first electrode, wherein the inorganic insulating or the broad band semiconducting material is configured to transport electrons and block holes and has a band gap of at least 2.5 eV;

TABLE 4

Light Emitting Diodes prepared in accordance with Example 7.

| Bottom Electrode | I-layer | Emisson layer | P-type semiconductor layer | Top electrode | Experiment ID (emission type) |
|---|---|---|---|---|---|
| ITO (sputter) | ZnO (precursor) | mCP:FIrpic (Thermal deposition) | MoO3 or NPB (Thermal deposition) | Ag (100 nm) (Thermal deposition) | 1 (Blue color, bottom emission) |
| Same as above | $Al_2O_3$ or $Ta_2O_5$—$Al_2O_3$ (surface oxidation) | Alq or CBP:Irppy3 (Thermal deposition) | same as above | Same as above | 2 (Green color, bottom emission) |
| Same as above | $ZrO_2$ (Surface oxidation) | BAlq (Thermal deposition) | Same as above | Same as above | 2 (Blue color, bottom emission) |
| ZrAl-alloy (Sputter) | $ZrO_{2-x}$ + $Al_2O_{3-y}$ (Surface oxidation) | PFO based Red, Green, blue polymer emitter (Spin-coating) | Same as above | Ag:MoO (20 nm, thermal deposition | 3 (red, green, blue colors, top emission) |
| ITO | ZnO | CdSe Quantum Dots (Spin or dip coating) | $MoO_3$ (Thermal deposition) | Ag(100 nm) | 4 (red, green, blue colors, bottom emission) |
| Ta or Ti (Sputter) | Ta2O5–x ot TiO2–x (Surface oxidation) | CdSe Quantum Dots | NPB or $MoO_3$ | Ag:MoO (20 nm) | 5 (red, green, blue colors, top emission) |

(c) a semiconductor layer or a stack of semiconductor layers over the I-layer,
wherein the semiconductor layer comprises:
(i) a first sublayer in contact with the I-layer comprising a material selected from the group consisting of an amorphous selenium, PbO, CdI, CdTe and HgI; and
(ii) a second sublayer comprising a p-type semiconductor over the first sublayer, wherein a band gap of the p-type semiconductor of the second sublayer is greater than a band gap of the material of the first sublayer; and
(d) a second electrode over the semiconductor layer or the stack, wherein at least one of the first and second electrodes is transparent.

2. The two-terminal X-ray or high energy radiation detector of claim 1, wherein the first electrode comprises a metal selected from the group consisting of Ti, Ta, Zn, In, Sn, Ga, Zr, and Y and an alloy comprising any of these metals.

3. The two-terminal X-ray or high energy radiation detector of claim 1, wherein the first electrode comprises a metal or a metal alloy and wherein the inorganic insulating or the broad band semiconducting material is a compound of the metal or of the metals of the metal alloy of the first electrode.

4. The two-terminal X-ray or high energy radiation detector of claim 1, wherein the p-type semiconductor sublayer comprises a material selected from the group consisting of TPD, NPB, polymers comprising TPD, polymers comprising NPB, PFO, MoO, NiO, NiN and SiC.

5. The two-terminal X-ray or high energy radiation detector of claim 1, wherein the first electrode is transparent to X-ray or high energy radiation.

6. The two-terminal X-ray or high energy radiation detector of claim 1, wherein the second electrode is transparent to X-ray or high energy radiation.

7. The two-terminal X-ray or high energy radiation detector of claim 1, wherein the p-type semiconductor sublayer comprises a material selected from the group consisting of MoO, NPB, and PPV.

8. The two-terminal X-ray or high energy radiation detector of claim 1, wherein the first semiconductor sublayer comprises amorphous selenium.

9. The two-terminal X-ray or high energy radiation detector of claim 1, wherein the inorganic insulating or the broad band semiconducting material is selected from the group consisting of ZnO, $TiO_2$, and $Ta_2O_5$.

10. The two-terminal X-ray or high energy radiation detector of claim 1, wherein the first semiconductor sublayer comprises amorphous selenium and the p-type semiconductor sublayer comprises MoO.

11. The two-terminal X-ray or high energy radiation detector of claim 1, wherein the second electrode comprises ITO or AlZnO.

12. An array for X-ray sensing or high energy radiation sensing comprising a plurality of imaging pixels, wherein each imaging pixel of the detector array comprises the detector of claim 1.

13. A two-terminal device comprising:
(a) a first electrode comprising a conductive material;
(b) an I-layer comprising an inorganic insulating or a broad band semiconducting material over the first electrode, wherein the inorganic insulating or the broad band semiconducting material is configured to transport electrons and block holes and has a band gap of at least 2.5 eV;
(c) a semiconductor layer or a semiconductor layer stack, the semiconductor layer comprising two sublayers, wherein the first sublayer is in contact with the I-layer and comprises a material selected from the group consisting of an organic semiconductor, CuO, PbS, CuInSe, CuInS, CuInGaSe, selenium, nanoparticles comprising at least one of PbS, PbSe, CdSe, and CdS, and a blend comprising any of these materials, and wherein the second sublayer comprises a p-type semiconductor configured for conducting holes and blocking electrons, wherein a band gap of the p-type semiconductor of the second sublayer is greater than a band gap of the material of the first sublayer; and
(d) a second electrode over the semiconductor layer or the stack, wherein at least one of the first and second electrodes is transparent, and wherein the two-terminal device is a visible light and/or IR detector or a photovoltaic device.

14. The two-terminal device of claim 13, wherein the organic semiconductor in the first sublayer is selected from the group consisting of PPV, MEHPPV, P3HT, PTB7, PCP-DTBT, PTZBTTT-BDT, PDDTT, and PCBM.

15. The two-terminal device of claim 13, wherein the conductive material of the first electrode is a metal selected from the group consisting of Ti, Ta, Zn, In, Sn, Ga, Zr, Y and a metal alloy comprising any of these metals.

16. The two-terminal device of claim 13, wherein the conductive material of the first electrode is a metal or a metal alloy, and wherein the inorganic insulating or a broad band semiconducting material of the I-layer is an oxide of the metal or of the metals of the alloy of the first electrode.

17. The two-terminal device of claim 13, wherein the p-type semiconductor in the second sublayer comprises a material selected from the group consisting of TPD, NPB, polymers comprising TPD, polymers comprising NPB, PFO, MoO, NiO, NiN and SiC.

18. The two-terminal device of claim 13, wherein the first electrode is transparent in the visible and/or infrared wavelength range.

19. The two-terminal device of claim 13, wherein the second electrode is transparent in the visible and/or infrared wavelength range.

20. The two-terminal device of claim 13, wherein the second electrode is transparent in the visible and/or infrared wavelength range and comprises a material selected from the group consisting of TCO, organic conductor, a thin layer of metal, and a thin layer of metal alloy.

21. A detector array comprising a plurality of imaging pixels, wherein each pixel comprises the two-terminal device of claim 13.

22. An X-ray or high energy radiation detector comprising the two-terminal device of claim 13 and a scintillator.

23. An X-ray or high energy radiation detector array comprising a plurality of imaging pixels, wherein each pixel comprises the two-terminal device of claim 13, and a scintillator.

24. The X-ray or high energy radiation detector array of claim 23, wherein the scintillator is a sheet covering the plurality of imaging pixels.

25. The X-ray or high energy radiation detector of claim 1, wherein the inorganic insulating or the broad band semiconducting material is a metal oxide having a bandgap of at least 2.5 eV.

26. The two-terminal device of claim 13, wherein the inorganic insulating or the broad band semiconducting material is a metal oxide having a bandgap of at least 2.5 eV.

27. The two-terminal device of claim 13, wherein the two-terminal device is a visible light detector and/or an IR detector.

* * * * *